(12) United States Patent
Kariyazaki

(10) Patent No.: US 10,147,690 B2
(45) Date of Patent: Dec. 4, 2018

(54) SEMICONDUCTOR DEVICE

(71) Applicant: Renesas Electronics Corporation, Koutou-ku, Tokyo (JP)

(72) Inventor: Shuuichi Kariyazaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/719,634

(22) Filed: Sep. 29, 2017

(65) Prior Publication Data

US 2018/0025998 A1 Jan. 25, 2018

Related U.S. Application Data

(63) Continuation of application No. 15/295,094, filed on Oct. 17, 2016, now Pat. No. 9,853,002.

(30) Foreign Application Priority Data

Dec. 18, 2015 (JP) .................................. 2015-247784

(51) Int. Cl.
*H01L 23/053* (2006.01)
*H01L 23/64* (2006.01)
(Continued)

(52) U.S. Cl.
CPC ...... *H01L 23/642* (2013.01); *H01L 23/49822* (2013.01); *H01L 23/49827* (2013.01);
(Continued)

(58) Field of Classification Search
CPC ............... H01L 23/66; H01L 23/49838; H01L 23/49827; H01L 23/49833;
(Continued)

(56) References Cited

U.S. PATENT DOCUMENTS 8,062,968 B1 * 11/2011 Conn .................... H01L 23/055
257/779
9,035,450 B2 5/2015 Kariyazaki et al.
(Continued)

FOREIGN PATENT DOCUMENTS

JP 2007-080946 A 3/2007
JP 2014-204057 A 10/2014

*Primary Examiner* — Shouxiang Hu
(74) *Attorney, Agent, or Firm* — Shapiro, Gabor and Rosenberger, PLLC

(57) ABSTRACT

A semiconductor device with enhanced performance. The semiconductor device has a high speed transmission path which includes a first coupling part to couple a semiconductor chip and an interposer electrically, a second coupling part to couple the interposer and a wiring substrate, and an external terminal formed on the bottom surface of the wiring substrate. The high speed transmission path includes a first transmission part located in the interposer to couple the first and second coupling parts electrically and a second transmission part located in the wiring substrate to couple the second coupling part and the external terminal electrically. The high speed transmission path is coupled with a correction circuit in which one edge is coupled with a branching part located midway in the second transmission part and the other edge is coupled with a capacitative element, and the capacitative element is formed in the interposer.

11 Claims, 17 Drawing Sheets

(51) Int. Cl.

| | |
|---|---|
| *H01L 23/66* | (2006.01) |
| *H01L 23/498* | (2006.01) |
| *H05K 1/02* | (2006.01) |
| *H01L 23/538* | (2006.01) |
| *H01L 23/50* | (2006.01) |
| *H01L 23/522* | (2006.01) |
| *H05K 1/18* | (2006.01) |

(52) U.S. Cl.
CPC .. *H01L 23/49833* (2013.01); *H01L 23/49838* (2013.01); *H01L 23/50* (2013.01); *H01L 23/5222* (2013.01); *H01L 23/5383* (2013.01); *H01L 23/66* (2013.01); *H05K 1/0231* (2013.01); *H01L 2223/6627* (2013.01); *H01L 2223/6661* (2013.01); *H01L 2224/16227* (2013.01); *H01L 2924/15192* (2013.01); *H01L 2924/15311* (2013.01); *H01L 2924/30111* (2013.01); *H05K 1/181* (2013.01); *H05K 2201/10378* (2013.01)

(58) Field of Classification Search
CPC ..... H01L 23/49822; H01L 2924/15311; H01L 2924/15192; H01L 2223/6627; H01L 2223/6661; H01L 2924/30111; H01L 2224/16227; H01L 23/50; H01L 23/5222; H01L 2924/30105; H01L 23/642; H01L 23/5383; H05K 1/0231; H05K 1/181; H05K 2201/10378

See application file for complete search history.

(56) References Cited

U.S. PATENT DOCUMENTS

| | | |
|---|---|---|
| 9,831,184 B2 * | 11/2017 | Yee ....................... H01L 21/486 |
| 2004/0184219 A1 | 9/2004 | Otsuka et al. |
| 2006/0035510 A1 | 2/2006 | Numata et al. |
| 2006/0223226 A1 | 10/2006 | Guzek et al. |
| 2011/0031598 A1 | 2/2011 | Lee et al. |

* cited by examiner

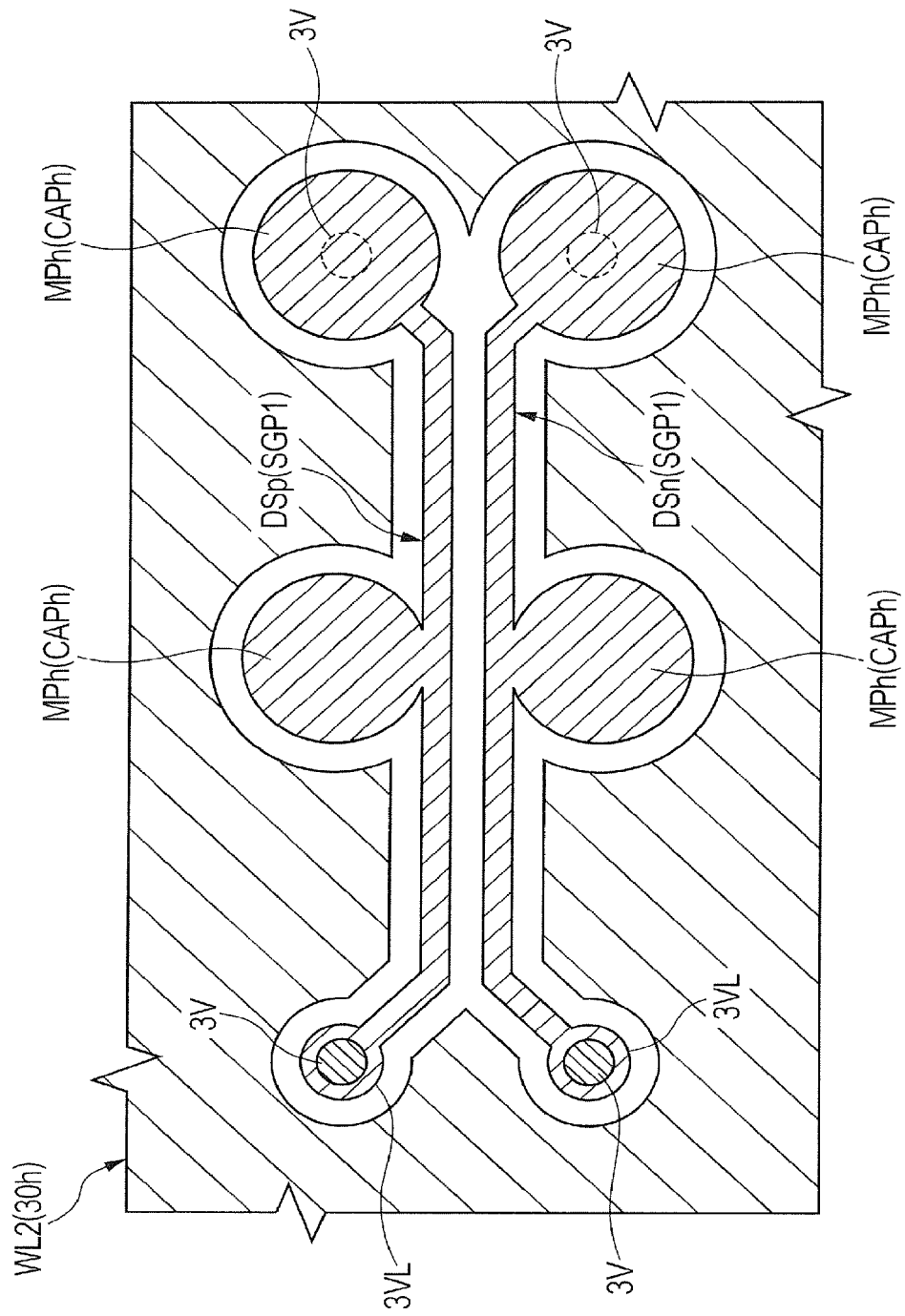

SEMICONDUCTOR DEVICE

CROSS-REFERENCE TO RELATED APPLICATIONS

The disclosure of Japanese Patent Application No. 2015-247784 filed on Dec. 18, 2015 including the specification, drawings and abstract is incorporated herein by reference in its entirety.

BACKGROUND

The present invention relates to semiconductor devices and more particularly to semiconductor devices in which a wiring substrate and a semiconductor chip are electrically coupled through an interposer.

Japanese Unexamined Patent Application Publication No. 2007-80946 discloses a semiconductor device with a semiconductor chip mounted over a wiring substrate through an interposer, in which a built-in capacitor electrically coupled with the semiconductor chip is formed in the interposer.

Japanese Unexamined Patent Application Publication No. 2014-204057 discloses a wiring substrate with a semiconductor chip mounted over it, in which a plurality of through hole wirings and via wirings to generate a capacitance for impedance matching are formed in different layers of a wiring region.

SUMMARY

The application fields of semiconductor devices include the communication technology field. In the communication technology field, efforts to increase the communication speed have been continued. In order to increase the communication speed, techniques to improve the signal transmission frequency, techniques to increase the number of signal transmission paths for concurrent transmission, techniques to reduce signal transmission loss, and techniques to combine these techniques are important.

As an effort toward the development of techniques to increase the communication speed, the present inventors have conducted research on a correction circuit for impedance matching to be built in a wiring substrate over which a semiconductor component is mounted. As a result of our research, we have found that there is room for improvement in a semiconductor device in which a wiring substrate and a semiconductor component are electrically coupled through an interposer.

The above and further objects and novel features of the invention will more fully appear from the following detailed description in this specification and the accompanying drawings.

According to one aspect of the present invention, in a semiconductor device, a first signal transmission path includes a first coupling part to couple a semiconductor component and a second substrate electrically, a second coupling part to couple the second substrate and a first substrate, and an external terminal formed on the first back surface of the first substrate. The first signal transmission path further includes a first transmission part located in the second substrate to couple the first coupling part and the second coupling part electrically and a second transmission part located in the first substrate to couple the second coupling part and the external terminal electrically. The first signal transmission path is coupled with a first circuit part having one edge coupled with a first branching part located midway in the second transmission part and the other edge coupled with a first capacitative element, and the first capacitative element is formed in the second substrate.

According to the one aspect of the present invention, the performance of the semiconductor device is enhanced.

BRIEF DESCRIPTION OF THE DRAWINGS

FIG. 20 is an enlarged plan view of the vicinity of an area where a correction circuit in a wiring substrate as a comparative example against the example shown in FIG. 9 is formed.

DETAILED DESCRIPTION

Rules of Description in the Specification

The preferred embodiments of the present invention may be described separately in different sections as necessary or for convenience sake, but the embodiments described as such are not irrelevant to each other unless otherwise expressly stated. Regardless of the order in which they are described, one embodiment may be, in part, a detailed form of another, or one embodiment may be, in whole or in part, a variation of another. Basically, descriptions of the same elements or things are not repeated. In the preferred embodiments, constituent elements are not necessarily essential unless theoretically essential or apparently essential for the context.

In description of a material or composition in an embodiment of the invention, the expression "X comprising A" does not exclude a material or composition which includes an element other than A unless otherwise expressly stated or unless obviously the context requires exclusion of another element. If the expression concerns a component, it means "X which contains A as a main component". For example, obviously the term "silicon member" refers to not only a member made of pure silicon but also a member made of SiGe (silicon germanium) alloy or another type of multi-component alloy which contains silicon as a main component or a silicon-based member which contains another additive. Similarly, for example, the terms "gold plating," "Cu layer," and "nickel plating" refer to not only members made of pure gold, Cu and nickel but also members made of multi-component materials which contain gold, Cu and nickel as main components, respectively.

Also, even when a specific numerical value or quantity is indicated for an element, the numerical value or quantity of the element may be larger or smaller than the specific numerical value or quantity unless otherwise expressly stated or unless theoretically limited to the specific value or quantity or unless the context requires the element to be limited to the specific value or quantity.

In all the drawings that show the preferred embodiments, the same or similar elements are designated by the same or similar reference signs or numerals and basically descriptions thereof are not repeated.

Regarding the accompanying drawings, hatching or the like may be omitted even in a cross section diagram if hatching may cause the diagram to look complicated or it is easy to distinguish the area concerned from an air gap. In connection with this, background outlines may be omitted even for a planarly closed hole if the contour of the hole is apparent from an explanation, etc. Furthermore, even if a drawing does not show a cross section, hatching or a dot pattern may be added to clarify that the area concerned is not an air gap or to show the border of the area clearly.

Electronic Device

Figure 1:
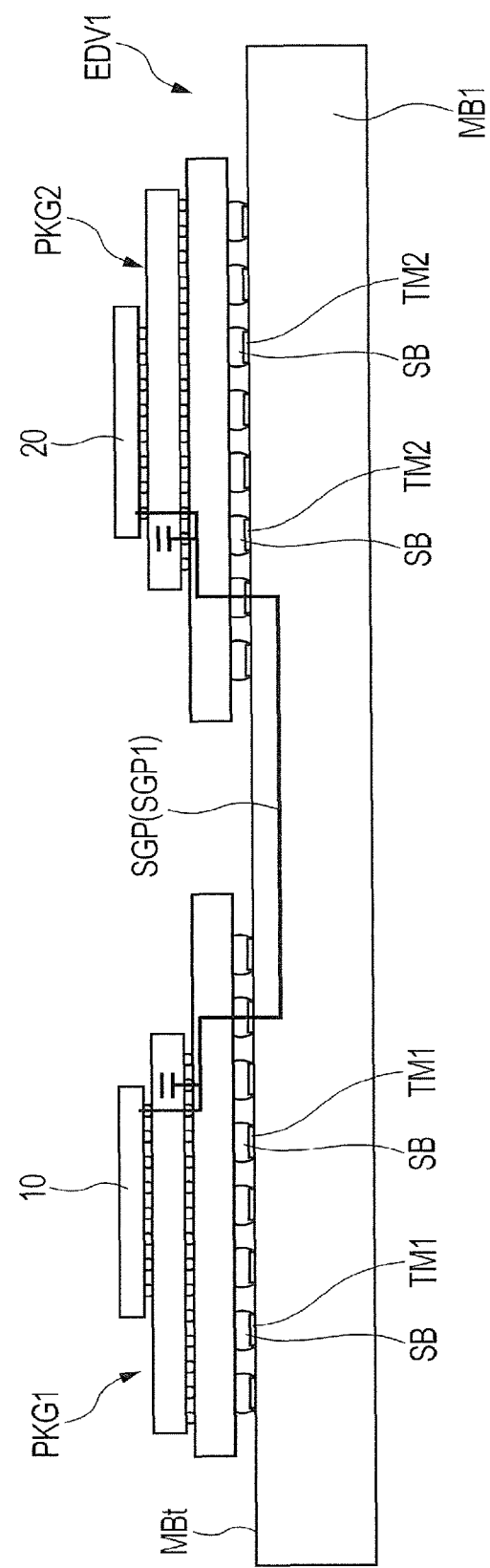
FIG. 1 illustrates an example of the configuration of an electronic device including a semiconductor device according to a first embodiment of the present invention.
Figure 2:
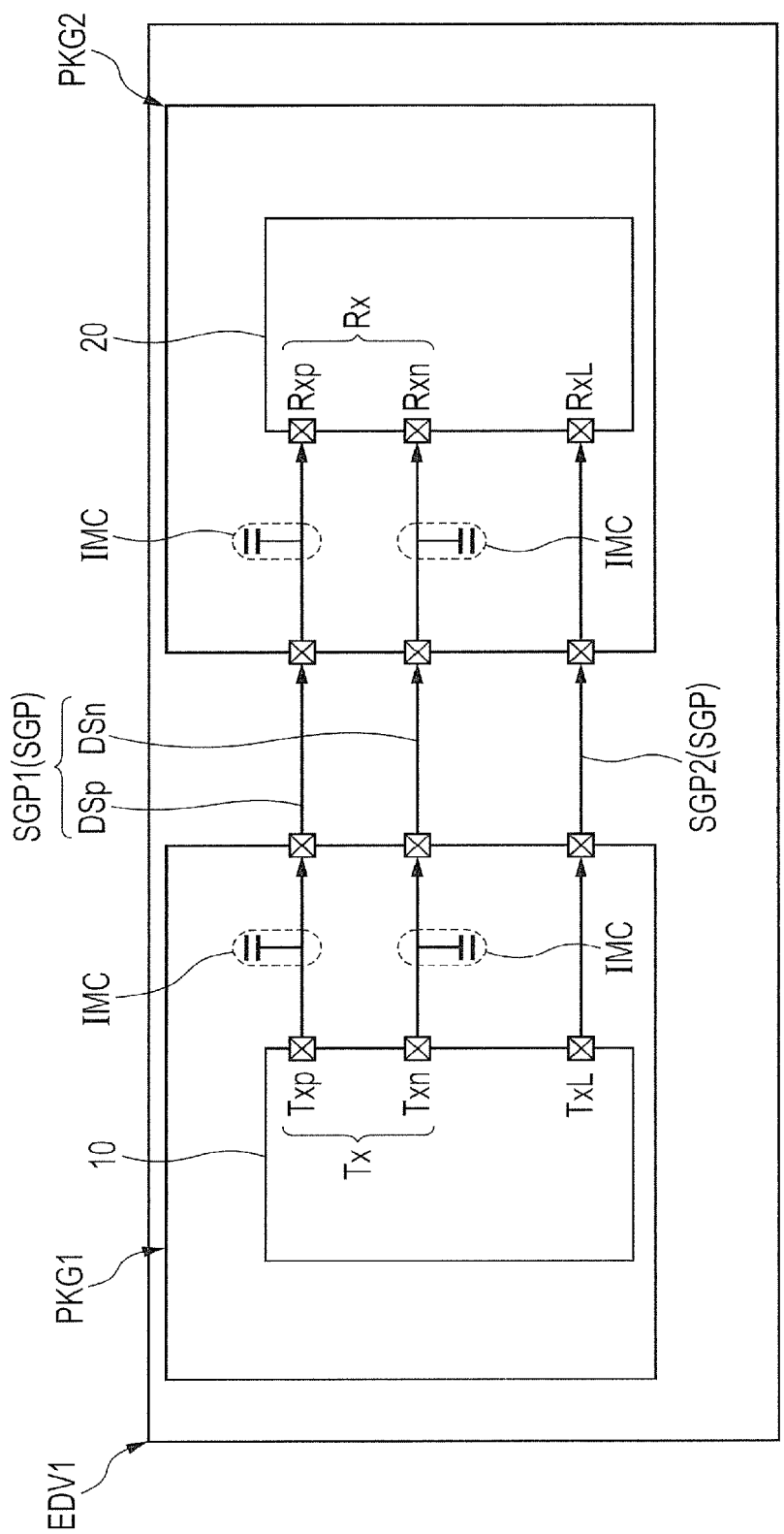
FIG. 2 illustrates an example of the configuration of a circuit of the electronic device shown in FIG. 1.

First, referring to FIGS. 1 and 2, an example of an electronic device (communication device) will be described in which a plurality of semiconductor devices (semiconductor packages) are mounted over a mother board and an electric signal is transmitted between semiconductor devices. FIG. 1 illustrates an example of the configuration of an electronic device including a semiconductor device according to the first embodiment of the present invention. FIG. 2 illustrates an example of the configuration of a circuit of the electronic device shown in FIG. 1. In FIG. 1, a high speed transmission path SGP1 is schematically expressed by bold line in order to show clearly that a semiconductor device PKG1 and a semiconductor device PKG2 are electrically coupled.

The electronic device (electronic apparatus) EDV1 shown in FIG. 1 includes a wiring board (mother board, mounting board) MB1, a semiconductor device PKG1 mounted over the wiring board MB1, and a semiconductor device PKG2 mounted over the wiring board MB1. The semiconductor devices PKG1 and PKG2 are electrically coupled through the signal transmission path SGP formed in the wiring board MB1.

More specifically, as shown in FIG. 2, the electronic device EDV1 has a plurality of signal transmission paths SGP. In the example shown in FIG. 2, the signal transmission paths SGP include a low speed transmission path SGP2 and a high speed transmission path SGP1. The high speed transmission path SGP1 transmits an electric signal at a first transmission speed. The low speed transmission path SGP2 transmits an electric signal at a second transmission speed slower than the first transmission speed. In the example shown in FIG. 2, the high speed transmission path SGP1 includes a pair of differential signal transmission paths DSp and DSn which transmit a differential signal.

This embodiment will be described below on the assumption that a differential signal is transmitted through a pair of differential signal transmission paths DSp and DSn as an example of the high speed transmission path SGP1. However, the invention may be applied to not only high speed differential signals but also other types of high speed signals. For example, even in the case of a so-called single-ended signal which is transmitted through a single signal transmission path SGP, high speed transmission can be made by increasing the frequency.

In the example shown in FIG. 2, the semiconductor chip (semiconductor component) 10 of the semiconductor device PKG1 has an electrode (electrode pad, chip electrode) TxL for low speed signal transmission which is coupled with the low speed transmission path SGP2. The semiconductor chip 10 also has an electrode (electrode pad, chip electrode) Tx for high speed signal transmission which is coupled with the high speed transmission path SGP1 (specifically, electrodes Txp and Txn which send a pair of differential signals).

On the other hand, the semiconductor chip 20 of the semiconductor device PKG2 has an electrode (electrode pad) RxL for low speed signal reception which is coupled with the low speed transmission path SGP2. The semiconductor chip 20 also has an electrode (electrode pad) Rx for high speed signal reception which is coupled with the high speed transmission path SGP1 (specifically, electrodes Rxp and Rxn which receive a pair of differential signals).

The low speed transmission path SGP2, formed by coupling the electrodes TxL and RxL electrically, transmits an electric signal, for example, at a transmission speed of less than 3 Gbps (Gigabit per second). The high speed transmission path SGP1, formed by coupling the electrodes Tx and Rx electrically, transmits an electric signal, for example, at a transmission speed of about 5 Gbps to 100 Gbps.

In order to suppress deterioration in the quality of an electric signal transmitted through a signal transmission path, it is desirable that transmission (output) impedance, reception (input) impedance, and impedance in the transmission path match each other. For example, if the signal transmission path is designed to have a characteristic impedance of 50Ω (ohms), when the transmission impedance and the reception impedance are both 50Ω, signals can be transmitted efficiently.

However, it has been found that if a transmission electrode and a reception electrode are coupled simply by a signal transmission path designed to have a characteristic impedance of 50Ω, signal quality deterioration due to signal reflection occurs, particularly in a high speed signal transmission path.

If the operating frequency of a signal input/output circuit is increased in order to increase the signal transmission speed, the parasitic capacitance of an input/output element (for example, a protective circuit element or electrode pad for input/output) causes a significant decline in the impedance of the input/output element (element for input or output). For example, if the input/output element is designed to have an impedance of 50Ω and operated at a frequency of 1.25 GHz (gigahertz), its impedance declines to 43Ω. If the input/output element is operated at a frequency of 5 GHz, its impedance declines to 14Ω. As the impedance of the input/output element declines, signal reflection may occur in the joint between the input/output element and the wiring coupled with it, resulting in signal quality deterioration. Such signal quality deterioration attributable to reflection can occur in both the electrode Tx for high speed signal transmission and the electrode Rx for high speed signal reception which are shown in FIG. 2.

Therefore, the present inventors have explored a method of suppressing signal quality deterioration due to a decline in the impedance of an input/output element in a high speed transmission path by providing a correction circuit for impedance matching in the vicinity of the input/output element. Specifically the present inventors have researched a method of improving the signal transmission characteristics through signal reflection by the correction circuits IMC, in which a correction circuit for impedance matching IMC is coupled to the vicinity of each of the transmission electrode Tx and the reception electrode Rx.

The correction circuit IMC has a capacitative element at an edge opposite to the joint located midway in the high speed transmission path. The wiring path distance from the capacitative element to the terminal end of the input/output element (for example, the electrode Tx or Rx) is, for example, $\lambda/4$ of signal frequency (¼ wavelength).

If the capacitative element is located at a position of $\lambda/4$ of signal frequency as mentioned above, for example the reception electrode Rx shown in FIG. 2 (namely, input element) operates as follows. The signal received by the input element is reflected by the parasitic capacitance of the input element and the reflected wave is again reflected by the capacitative element of the correction circuit IMC and returned to the input element end (input end) with its phase shifted $\lambda/2$. Consequently, the wave reflected by the parasitic capacitance of the input element and the wave reflected by the capacitative element of the correction circuit IMC offset each other. Since signal reflection at the joint with the wiring coupled with the input/output element is thus eliminated by the capacitative element inserted in the position of $\lambda/4$ of signal frequency, the signal characteristics in the signal transmission path are improved.

On the other hand, the transmission electrode Tx (namely, output element) operates as follows. Part of the signal sent from the output element end is reflected due to the parasitic capacitance of the output element. The non-reflected part of the signal is partially reflected by the capacitative element of the correction circuit IMC and returned to the output element end (output end) with its phase shifted $\lambda/2$. Consequently, the wave reflected due to the parasitic capacitance of the output element and the wave reflected by the capacitative element of the correction circuit IMC offset each other. Since signal reflection at the joint with the wiring coupled with the input/output element is thus eliminated by the capacitative element inserted in the position of $\lambda/4$ of signal frequency, the signal characteristics in the signal transmission path are improved.

The distance from the capacitative element to the terminal end of the input/output element is a length equivalent to one quarter of the wavelength $\lambda$ depending on the frequency in the required signal band in the signal transmission path (in the example shown in FIG. 2, high speed transmission path SGPT). The length equivalent to one quarter of the wavelength $\lambda$ may be ideal wiring length $\lambda/4$ or in the allowable error range of the ideal wiring length $\lambda/4$. For example, the allowable error range is ±20% of $\lambda/4$. Since the input/output element is actually not a simple capacitance or resistance but a combination of these, the optimum characteristics may not be achieved even if the wiring length is $\lambda/4$ or the ideal wiring length. Furthermore, signal reflection at the terminal end of the input/output element or at the capacitative element of the correction circuit IMC may be untimely depending on the time constant determined by the product (CR) of capacitance component (C) and resistance component (R) of the wiring path. For this reason, the distance from the capacitative element to the terminal end of the input/output element must be determined taking the degree of untimeliness of signal reflection into consideration. If that is the case, the optimum distance from the capacitative element to the terminal end of the input/output element should be determined taking a simulation result or an actual measurement result into consideration. As a result, in some cases, the distance from the capacitative element to the terminal end of the input/output element is, for example, in the range from $\lambda/8$ to $\lambda/4$.

In the method which uses a correction circuit IMC to improve signal transmission characteristics, a correction circuit IMC must be coupled with each of a plurality of signal transmission paths. In addition, as mentioned above, since the impedance of the input/output element largely declines as the signal transmission frequency increases, capacitative elements must be provided at several points in a correction circuit IMC which reflects a signal. Consequently, the area occupied by the conductor patterns which configure the capacitative elements increases. Also, in order to increase the number of signal transmission paths, many wirings must be formed for signal transmission paths, but the presence of many capacitative elements decreases the resources for formation of signal transmission path wirings. As a consequence, the planar size of the wiring substrate and the number of wiring layers in the wiring substrate must be increased and the wiring structure becomes complicated. From another viewpoint, the number of signal transmission paths is limited due to restrictions on the planar size of the wiring substrate and the number of wiring layers.

Semiconductor Device

Next, the structure of the semiconductor device according to this embodiment will be described. In this section, the basic structure of the semiconductor device will be overviewed and in the next section, a correction circuit coupled with a high speed signal transmission path will be explained in detail.

From this section onwards, the semiconductor device PKG1 will be explained as a typical example, though the semiconductor device PKG1 and semiconductor device PKG2 are shown in FIGS. 1 and 2. As mentioned above, the use of a correction circuit IMC is effective for both the semiconductor device PKG1 for transmission and the semiconductor device PKG2 for reception. Therefore, the explanation of the semiconductor device PKG1 given below can be applied to the semiconductor device PKG2 by changing the direction of the arrow for the high speed transmission path SGP1 shown in FIG. 7 to the direction from the external terminal CP3 to the semiconductor chip 10, though the same explanation is not repeated here for the semiconductor device PKG2.

Figure 3:
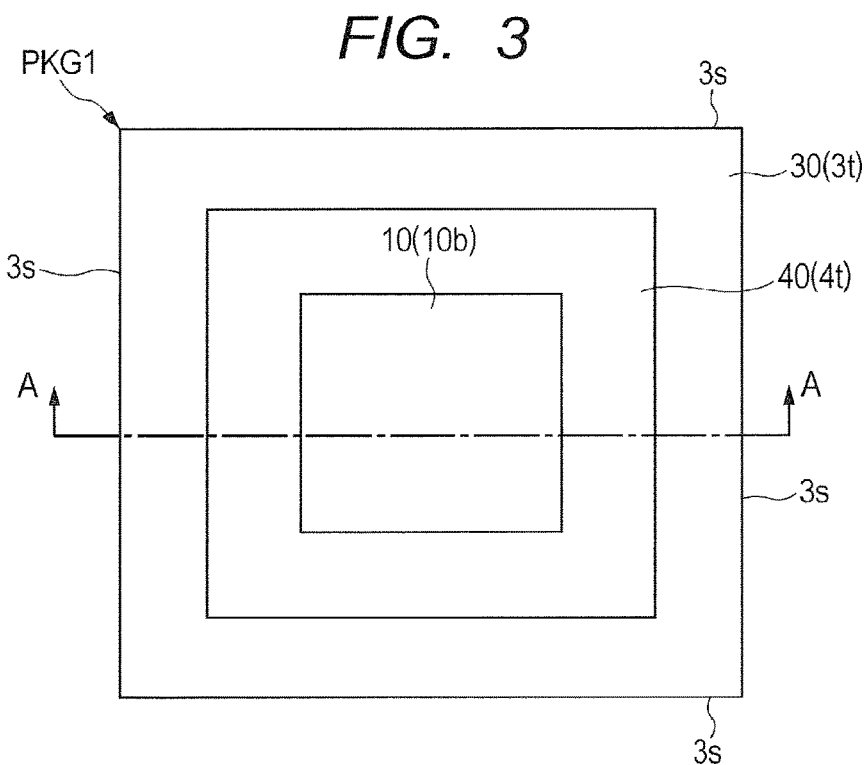
FIG. 3 is a top view of one of the semiconductor devices shown in FIG. 1.
Figure 4:
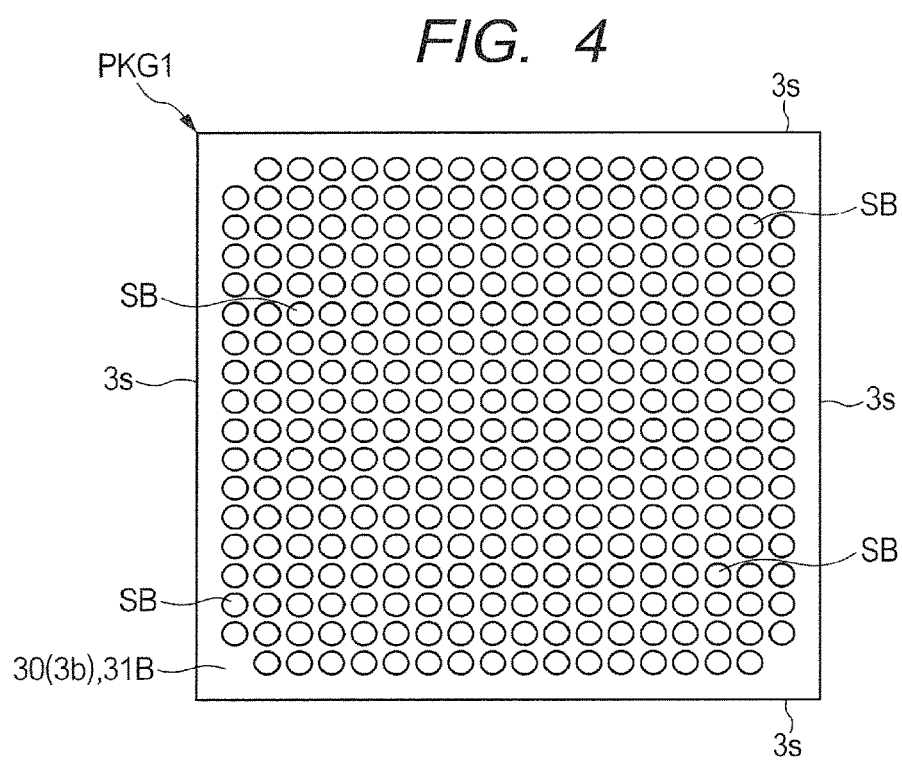
FIG. 4 is a bottom view of the semiconductor device shown in FIG. 3.
Figure 5:
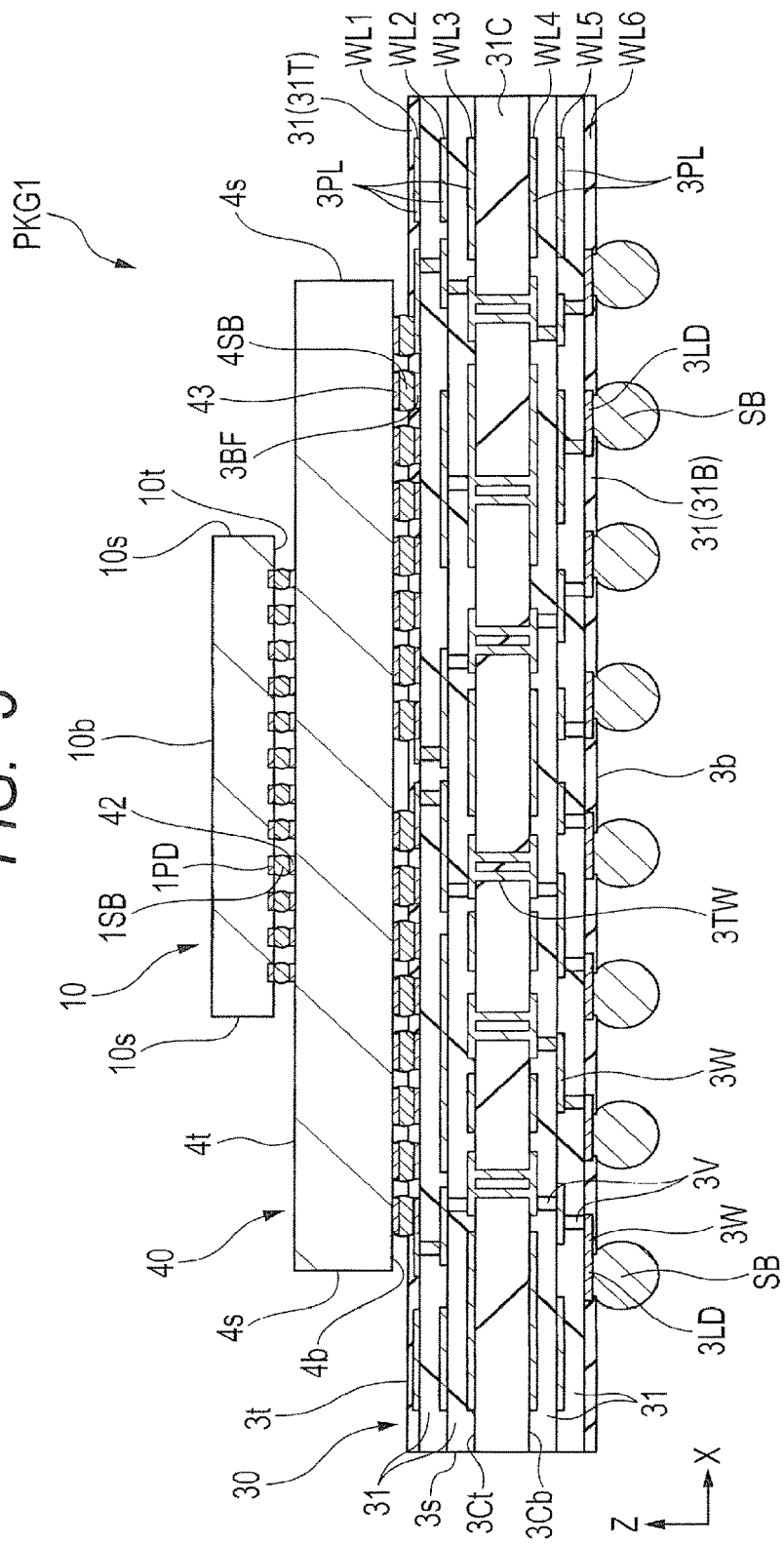
FIG. 5 is an enlarged sectional view taken along the line A-A of FIG. 3.
Figure 6:
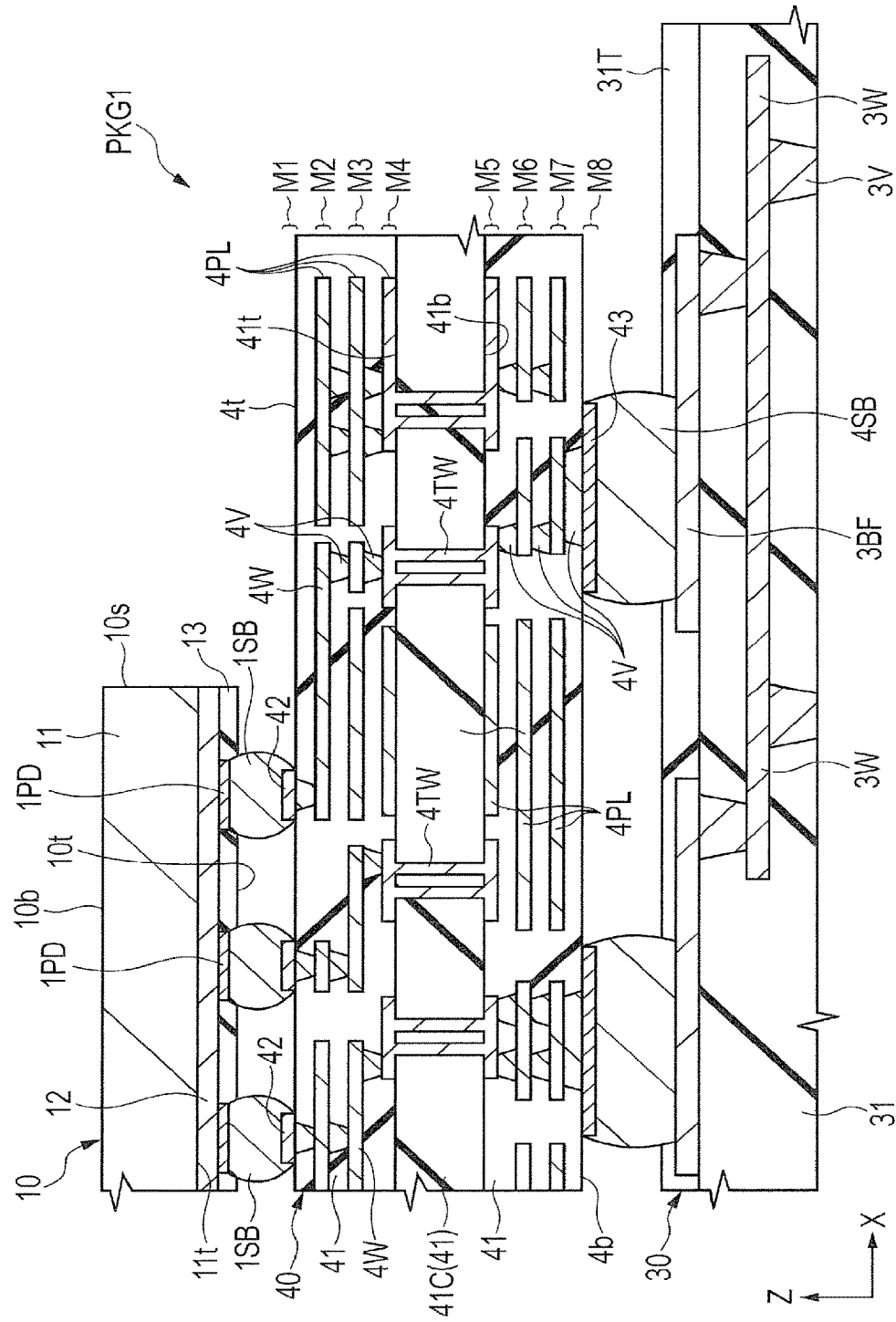
FIG. 6 is an enlarged fragmentary sectional view of the interposer shown in FIG. 5.

FIG. 3 is a top view of one of the semiconductor devices shown in FIG. 1. FIG. 4 is a bottom view of the semiconductor device shown in FIG. 3. FIG. 5 is an enlarged sectional view taken along the line A-A of FIG. 3. FIG. 6 is an enlarged fragmentary sectional view of the interposer shown in FIG. 5.

For the ease of understanding, a small number of terminals are shown in FIGS. 3 to 5. The number of terminals is not limited to the number of terminals shown in FIGS. 3 to 5. The structure shown here may be applied to a semiconductor device which has 100 to 10,000 terminals such as pads 1PD, bottom surface terminals 43 or lands 3LD. For the ease of understanding, the wirings 4W of the interposer 40 shown in FIG. 6 are omitted in FIG. 5.

As shown in FIGS. 3 and 5, the semiconductor device PKG1 according to this embodiment includes a wiring substrate (first substrate, package substrate) 30, an interposer (second substrate, relay board) 40 mounted over the wiring substrate 30, and a semiconductor chip 10 mounted over the interposer 40. The semiconductor chip 10 is mounted over the wiring substrate 30 through the interposer 40.

As shown in FIG. 5, the wiring substrate 30 has a top surface (surface, chip mounting surface, first front surface) 3t over which the semiconductor chip 10 is mounted through the interposer 40, a bottom surface (surface, packaging surface, first back surface) 3b opposite to the top surface 3t, and a side surface 3s located between the top surface 3t and bottom surface 3b. As shown in FIG. 3, the wiring substrate 30 has a square shape in a plan view.

The interposer 40 has a top surface (surface, chip mounting surface, second front surface) 4t over which the semiconductor chip 10 is mounted, a bottom surface (surface, packaging surface, second back surface) 4b opposite to the top surface 4t, and a side surface 4s located between the top surface 4t and bottom surface 4b. As shown in FIG. 3, the interposer 40 has a square shape in a plan view. The interposer 40 is mounted over the wiring substrate 30 with the bottom surface 4b facing the top surface 3t of the wiring substrate 30.

The semiconductor chip 10 has a front surface (main surface, top surface) 10t, a back surface (main surface, bottom surface) 10b opposite to the front surface 10t, and a side surface 10s located between the front surface 10t and back surface 10b. As shown in FIG. 3, the semiconductor chip 10 has a square shape in a plan view. In the example shown in FIG. 5, the semiconductor chip 10 is mounted over the interposer 40 in a manner that the front surface 10t, where a plurality of pads (electrodes, chip electrodes, electrode pads) 1PD are formed, faces the top surface 4t of the interposer 40. This kind of mounting method is called the face-down mounting method. The method in which the semiconductor chip 10 and the interposer 40 are electrically coupled while the surface holding pads 1PD faces the top surface 4t of the interposer 40 is called the flip-chip coupling method.

The wiring substrate 30 is the base material of the semiconductor device PKG1, and a plurality of solder balls SB as external terminals of the semiconductor device PKG1 are formed on the bottom surface 3b of the wiring substrate 30 as shown in FIG. 4. In the example shown in FIG. 4, the solder balls (external terminals, electrodes, external electrodes) SB are arranged in rows and columns (array pattern, matrix pattern). Each of the solder balls SB is coupled with a land (external terminal, electrode, external electrode) 3LD (see FIG. 5).

A semiconductor device which has a plurality of external terminals (solder balls SB, lands 3LD) arranged in rows and columns on the packaging surface like the semiconductor device PKG1 is called an area array semiconductor device.

In the area array type semiconductor device PKG1, the packaging surface (bottom surface 3b) of the wiring substrate 30 can be effectively used as space for external terminals, so that this type of semiconductor device is desirable because the increase in the required packaging area of the semiconductor device PKG1 can be suppressed even when the number of external terminals is increased. In short, even when the semiconductor device PKG1 has a larger number of external terminals to cope with the tendency toward higher functionality or higher integration, the semiconductor device PKG1 with an increasing number of external terminals can be packaged in a compact manner.

In the example shown in FIG. 4, regarding the planar size (dimensions in a plan view, dimensions of the top surface 3t and bottom surface 3b, external size) of the wiring substrate 30, the wiring substrate 30 has the shape of a square or rectangle in which the length of one side is, for example, 12 mm to 60 mm or so. Regarding the thickness (height) of the wiring substrate 30, the distance from the top surface 3t to the bottom surface 3b as shown in FIG. 5 is, for example, 0.3 mm to 1.3 mm or so.

The wiring substrate 30 is a relay board which electrically couples the interposer 40 mounted over the top surface 3t and the wiring board MB1 as the mother board (packaging board) shown in FIG. 1. The wiring substrate 30 has a plurality of wiring layers (six layers in the example shown in FIG. 5) WL1, WL2, WL3, WL4, WL5, and WL6 which electrically couple the top surface 3t as the chip mounting surface (device mounting surface, component mounting surface) and the bottom surface 3b as the packaging surface. Each wiring layer has a conductor wiring pattern as a path to supply an electric signal or power and is covered by an insulating layer 31 for isolation between paths. Adjacent wiring layers in the thickness direction are electrically coupled through interlayer conduction paths such as via wirings 3V or through hole wirings 3TW.

Among the wiring layers, the wiring layer WL1, nearest to the top surface 3t, is mostly covered by an insulating layer 31T as a solder resist film. Among the wiring layers, the wiring layer WL6, nearest to the bottom surface 3b, is mostly covered by an insulating layer 31B as a solder resist film.

The wiring substrate 30 is formed, for example, by stacking a plurality of wiring layers over and under an insulating layer (core material, core insulating layer) 31C as a prepreg of resin-impregnated glass fiber by the build-up method. The wiring layer WL3 adjacent to the top surface 3Ct of the insulating layer 31C and the wiring layer WL4 adjacent to the bottom surface 3Cb of the insulating layer 31C are electrically coupled through a plurality of through hole wirings 3TW buried in a plurality of through holes made in a manner to penetrate the insulating layer 31C from one of the top surface 3Ct and bottom surface 3Cb to the other surface.

A plurality of terminals (bonding pads, bonding leads, chip coupling terminals) 3BF to be electrically coupled with the semiconductor chip 10 are formed on the top surface 3t of the wiring substrate 30. A plurality of lands 3LD as external input/output terminals of the semiconductor device PKG1 are formed on the bottom surface 3b of the wiring substrate 30. The terminals 3BF and lands 3LD are electrically coupled through the wirings 3W, via wirings 3V, and through hole wirings 3TW made in the wiring substrate 30.

In the example shown in FIG. 5, the wiring substrate 30 has a laminated structure in which several wiring layers are stacked over and under the insulating layer 31C as the core material of the wiring substrate 30. As a variation of the structure shown in FIG. 5, a so-called coreless substrate may be used in which an insulating layer 31C of a hard material such as a prepreg is not provided but insulating layers 31 and conductor patterns such as wirings 3W are stacked sequentially. If a coreless substrate is used, through hole wirings 3TW are not made and the wiring layers are electrically coupled through via wirings 3V. Although FIG. 5 shows an example that the wiring substrate 30 has six wiring layers, instead the wiring substrate may have seven or more wiring layers or five or fewer wiring layers.

Figure 11:
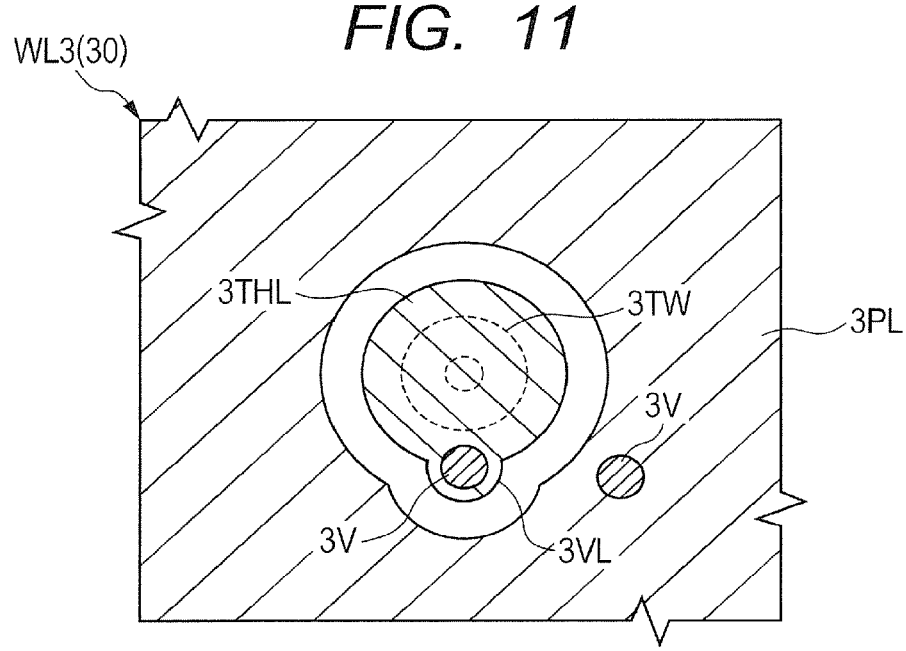
FIG. 11 is an enlarged plan view of a conductor pattern (through hole land) coupled with a through hole wiring of the wiring substrate shown in FIG. 5 and its vicinity.

The wiring substrate 30 has a large conductor plane (conductor pattern) 3PL formed in a manner to surround a conductor pattern such as a wiring 3W. For example, FIG. 9, which will be explained later, shows a conductor plane 3PL disposed so as to surround several wirings 3W and several via lands 3VL in the wiring layer WL2. FIG. 11, which will be explained later, shows a conductor plane 3PL disposed so as to surround a through hole land 3THL in the wiring layer WL3. The conductor plane 3PL is a conductor pattern formed in an area where conductor patterns such as wirings or terminals for signal transmission are not formed and it is part of a path to supply a reference potential or power supply potential. The conductor plane 3PL is provided, for example, in each of the wiring layers WL1, WL2, WL3, WL4 and WL5 shown in FIG. 5.

In the example shown in FIG. 5, a solder ball (solder material, external terminal, electrode, external electrode) SB is coupled with each of the lands 3LD. The solder balls SB are conductive members which electrically couple a plurality of terminals (not shown) of the wiring board MB1 shown in FIG. 1 and the lands 3LD when mounting the semiconductor device PKG1 over the wiring board MB1. A solder ball SB is an Sn—Pb solder member which contains lead (Pb) or a lead-free solder member which contains substantially no lead. For example, lead-free solder materials include tin (Sn), tin-bismuth (Sn—Bi), tin-copper-silver (Sn—Cu—Ag), and tin-copper (Sn—Cu). Here, "lead-free" means that the content of lead (Pb) is 0.1 wt % or less, as stipulated by the RoHS (Restriction of Hazardous Substances) Directive.

As shown in FIG. 5, the semiconductor device PKG1 includes an interposer 40 mounted over the wiring substrate 30. The interposer 40 is mounted over the top surface 3t of the wiring substrate 30 with its bottom surface 4b facing the top surface 3t of the wiring substrate 30. The interposer 40 is a relay board which lies between the wiring substrate 30 and the semiconductor chip 10. As a variation of this embodiment, a plurality of semiconductor chips 10 may be mounted over the interposer 40. If that is the case, the semiconductor chips 10 may be electrically coupled with each other through the interposer 40.

As shown in FIG. 6, the interposer 40 is a multi-layer wiring substrate in which a plurality of wiring layers are stacked. In the example shown in FIG. 6, the interposer 40 has a total of eight wiring layers M1, M2, M3, M4, M5, M6, M7, and M8 in order from the top surface 4t. Each of the wiring layers has conductor patterns such as wirings 4W and adjacent conductor patterns are covered by an insulating layer 41. The number of wiring layers in the interposer 40 is not limited to the number of wiring layers shown in FIG. 3 and it may be smaller or larger than 8.

In the example shown in FIG. 6, the interposer 40 has a laminated structure in which a plurality of wiring layers are stacked over and under an insulating layer (core layer, core material, core insulating layer) 41C as a base material. The insulating layer 41C is the base material of the interposer 40 and made of, for example, insulating material such as glass fiber impregnated with resin such as epoxy resin.

The insulating layers 41 stacked over and under the insulating layer 41C are made of, for example, an organic insulating material such as thermosetting resin. Alternatively the insulating layers 41 may be made of glass material (inorganic insulating material) such as silicon dioxide ($SiO_2$). If the insulating layers 41 are made of an inorganic insulating material, the flatness of the insulating layer 41 as the base of each wiring layer can be improved and thus the wiring width of wirings 4W can be decreased or the arrangement density of wirings 4W can be higher than the arrangement density of wirings 3W of the wiring substrate 30. The wiring layers stacked over and under the insulating layer 41C can be formed, for example, by the build-up method.

In the wiring layers of the interposer 40, wiring patterns are arranged at a finer pitch than in the wiring layers of the wiring substrate 30. In the example shown in FIG. 6, the thickness of the wirings 3W of the wiring substrate 30 is 15 μm to 20μ or so. On the other hand, the thickness of the wirings 4W of the interposer 40 is 3 μm to 6 μm or so. Regarding the wiring layers of the wiring substrate 30, the distance between adjacent wiring layers in the thickness direction is 25 μm to 35 μm or so. On the other hand, regarding the wiring layers of the interposer 40, the distance between adjacent wiring layers in the thickness direction is 3 μm to 8 μm or so. As can be known from this, the distance between adjacent wiring layers in the thickness direction among the wiring layers of the interposer 40 is shorter than the distance between adjacent wiring layers in the thickness direction among the wiring layers of the wiring substrate 30. Since the interposer 40 has thinner conductor patterns than the wiring substrate 30, the width of each conductor pattern and the arrangement pitch in the interposer 40 can be smaller in a plan view. For example, in this embodiment, the minimum width of wirings 3W (wiring width: length of a wiring in the direction perpendicular to the direction in which the wiring extends) in each of the wiring layers of the wiring substrate 30 shown in FIG. 6 is about 13 μm. The minimum distance (spacing) between adjacent conductor patterns in each of the wiring layers of the wiring substrate 30 is about 13 μm. On the other hand, the minimum width of wirings 4W in each of the wiring layers of the interposer 40 shown in FIG. 6 is 2 μm to 6 μm or so. The minimum distance (spacing) between adjacent conductor patterns in each of the wiring layers of the interposer 40 is 2 μm to 6 μm or so.

In short, in the semiconductor device PKG1 according to this embodiment, the interposer 40, formed with a higher density than the wiring substrate 30, is mounted over the wiring substrate 30 and the semiconductor chip 10 is electrically coupled with the wiring substrate 30 through the interposer 40. This means that many wiring paths coupled with the semiconductor chip 10 can be arranged with higher density than when the interposer 40 is not provided. In other words, the number of wiring paths coupled with the semiconductor chip 10 can be increased by placing the interposer 40 with fine-pitch patterns between the semiconductor chip 10 and the wiring substrate 30.

The wiring layers of the interposer 40 are electrically coupled through via wirings 4V and through hole wirings 4TW which are interlayer conduction paths. More specifically, the insulating layer 41C has a top surface 41t and a bottom surface 41b opposite to the top surface 41t. The insulating layer 41C has a plurality of through holes penetrating it from one of the top surface 41t and the bottom surface 41b to the other surface and a plurality of through hole wirings 4TW formed by burying conductor in the through holes. Each of the through hole wirings 4TW serves as an interlayer conduction path which electrically couples the wiring layer M4 lying over the top surface 41t of the insulating layer 41C and a wiring layer M5 lying under the bottom surface 41b of the insulating layer 41C.

The wiring layers M4, M3, M2, and M1 stacked over the top surface 41t of the insulating layer 41C are mutually coupled electrically through a plurality of via wirings 4V. The wiring layers M5, M6, M7, and M8 stacked under the bottom surface 41b of the insulating layer 41C are mutually coupled electrically through a plurality of via wirings 4V. As a variation of the arrangement of wiring layers of the interposer 40, the number of wiring layers stacked over the top surface 41t of the insulating layer 41C may be different from the number of wiring layers stacked under the bottom surface 41b of the insulating layer 41C, provided that the shape of the interposer 40 can be maintained. If the number of wiring layers stacked over the top surface 41t of the insulating layer 41C is larger than the number of wiring layers stacked under the bottom surface 41b of the insulating layer 41C, the number of wiring layers for wiring paths which do not involve through hole wirings 4TW can be increased and at the same time the thickness of the interposer 40 can be decreased.

A via wiring 4V is, for example, formed as follows. First, an insulating layer 41 is formed so as to cover a base wiring layer, then an opening is made in part of the insulating layer 41 to expose the base wiring layer partially. Then, conductor is buried in the opening to form a via wiring 4V. After the formation of the via wiring 4V, another wiring layer is stacked over the via wiring 4V so that the overlying wiring layer and the underlying wiring layer are electrically coupled.

The interposer 40 has a large conductor plane (conductor pattern) 4PL formed in a manner to surround a conductor pattern such as a wiring 4W. For example, FIG. 8, which will be explained later, shows a conductor plane 4PL which surrounds each of the electrodes MP1 in the wiring layer M6. Also, FIG. 12, which will be explained later, shows a conductor plane 4PL which surrounds a through hole land 4THL in the wiring layer M5. Like the conductor plane 3PL formed in the wiring substrate 30 (see FIG. 5), the conductor plane 4PL is a conductor pattern formed in an area where conductor patterns such as signal transmission wirings and terminals are not formed, and it is part of a path to supply a reference potential or power supply potential. A conductor planer 4PL is formed, for example, in each of the wiring layers M2, M3, M4, M5, M6, and M7 shown in FIG. 6.

A plurality of top surface terminals (bonding pads, terminals, semiconductor component mounting surface terminals, component coupling terminals) 42 (see FIG. 6) are formed on the top surface 4t of the interposer 40. Each of the top surface terminals 42 is electrically coupled with a pad 1PD of the semiconductor chip 10, for example, through a bump electrode 1SB made of solder. In the example shown in FIG. 6, a via wiring 4V coupled with a top surface terminal 42 is formed just under the top surface terminal 42 (in a manner to overlap the top surface terminal 42 in the thickness direction). In this case, space is not needed for coupling the via wiring 4V and the top surface terminal 42, so that the arrangement density of top surface terminals 42 can be increased. As a variation of the example shown in FIG. 6, in order to couple a top surface terminal 42 and a via wiring 4V, a lead wiring (not shown) coupled with a top surface terminal 42 may be formed in the wiring layer M1 so that the via wiring 4V and the top surface terminal 42 are coupled through the lead wiring, though not shown in the figure.

In this embodiment, ball-shaped electrodes of solder are used as the bump electrodes 1SB shown in FIG. 6. However, the bump electrode 1SB may be in other various forms. For example, a pillar bump (pillar electrode) which has a solder film on the tip face of a conductor pillar of copper (Cu) or nickel (Ni) may be used as a bump electrode 1SB.

A plurality of bottom surface terminals (terminals, soldering pads, lands, wiring substrate coupling terminals) 43 are formed on the bottom surface 4b of the interposer 40. Each of the bottom surface terminals 43 is electrically coupled with one of the terminals 3BF of the wiring substrate 30, for example, through a bump electrode 4SB of solder or the like.

In the example shown in FIG. 6, a via wiring 4V coupled with a bottom surface terminal 43 is formed just above the bottom surface terminal 43 (in a manner to overlap the bottom surface terminal 43 in the thickness direction). In this case, space is not needed for coupling the via wiring 4V and the bottom surface terminal 43, so that the arrangement density of bottom surface terminals 43 can be increased. In the example shown in FIG. 6, the surface area of a bottom surface terminal 43 is larger than the surface area of a top surface terminal 42. As a variation of the example shown in FIG. 6, like the above variation of the wiring layer M1, in order to couple a bottom surface terminal 43 and a via wiring 4V, a lead wiring (not shown) coupled with the bottom surface terminal 43 may be formed in the wiring layer M8 so that the via wiring 4V and the bottom surface terminal 43 are coupled through the lead wiring.

In the example shown in FIG. 6, the top surface terminals and bottom surface terminals 43 are not covered by an insulating film and exposed from the insulating layer 41. As a variation of the example shown in FIG. 6, an insulating film (solder resist film) for covering the top surface terminals 42 and an insulating film (solder resist film) for covering the bottom surface terminals 43 may be formed. In this case, openings should be made in the insulating films so that the top surface terminals 42 and the bottom surface terminals 43 are each partially exposed from the insulating films in the openings and the bump electrodes 1SB can be coupled with the top surface terminals 42 and the bump electrodes 4SB can be coupled with the bottom surface terminals 43.

In addition to the above variations of the interposer 40 in terms of the number of wiring layers, the interposer 40 may be modified in other various ways. For example, as a variation of the example shown in FIG. 6, a so-called coreless substrate which has no insulating layer 41C may be used. As another variation of the example shown in FIG. 6, a so-called silicon interposer may be adopted in which a semiconductor substrate such as a silicon (Si) substrate is used as a base material and a plurality of wiring layers are stacked over the main surface of the semiconductor substrate.

However, when forming a wiring substrate with a plurality of wiring layers, the flatness of each wiring layer must be improved in order to decrease the width of each of the wirings and the spacing between wirings. In general, when the build-up method is adopted to stack wiring layers, as the number of wiring layers to be stacked is larger, it is harder to ensure the flatness of upper wiring layers. The method used in this embodiment, in which an insulating layer 41C is formed and wiring layers are stacked on the top surface 41t and the bottom surface 41b of the insulating layer 41C, is desirable because the number of wiring layers can be increased and the flatness of each wiring layer can be improved.

As shown in FIG. 3, the semiconductor device PKG1 includes a semiconductor chip 10 which is mounted over the top surface 4t of the interposer 40. As shown in FIG. 6, the semiconductor chip 10 includes a silicon substrate (base material) 11 having a main surface 11t and a wiring layer 12 lying over the main surface 11t. In FIG. 6, a single wiring layer is shown for the ease of understanding but the wiring layer 12 shown in FIG. 6 has a laminated structure in which wiring layers thinner than the wiring layers M1, M2, and M3 of the interposer 40 are stacked. In addition, a plurality of wirings are formed in each of the wiring layers 12, though not shown in the figure for the ease of understanding. The wirings are covered by insulating layers which isolate the wirings and adjacent wiring layers from each other. The insulating layer is, for example, an inorganic insulating layer made of semiconductor oxide such as silicon oxide (SiO).

A plurality of semiconductor elements such as transistor elements and diode elements are formed on the main surface 11t of the silicon substrate 11 of each of the semiconductor chips 10. The semiconductor elements are electrically coupled with a plurality of pads 1PD formed on the front surface 10t through a plurality of wirings in the wiring layers 12.

In this embodiment, each of the semiconductor chips 10 is mounted over the top surface 4t of the interposer 40 with the front surface 10t facing the top surface 4t of the interposer 40. This mounting method is called the face-down mounting method or flip-chip coupling method. In the flip-chip coupling method, the semiconductor chip 10 and the interposer 40 are electrically coupled as follows.

A plurality of pads (surface electrodes, component electrodes, electrode pads) 1PD are formed over the wiring layers 12 of the semiconductor chip 10. Part of each of the pads 1PD is exposed from a passivation film 13 as a protective insulating film on the front surface 10t of the semiconductor chip 10. The pad 1PD is electrically coupled with atop surface terminal 42 of the interposer 40 through a bump electrode 1SB coupled with the exposed part of the pad 1PD.

This embodiment has been explained on the assumption that the semiconductor chip 10 is directly mounted over the interposer 40; however, instead of the semiconductor chip 10 shown in FIG. 5, a semiconductor package (semiconductor component) incorporating a semiconductor chip may be mounted. The semiconductor component may be a semiconductor package which incorporates a plurality of semiconductor chips.

Correction Circuit

Next, where to form a correction circuit for impedance matching and couple it with a high speed transmission path will be described using the semiconductor device PKG1 according to this embodiment. The figures described below show only one among the plural (many) high speed transmission paths SGPT of the semiconductor device PKG1, as a typical example. This means that each of the high speed transmission paths SGP1 is coupled with a correction circuit IMC1 like the high speed transmission path SGP1 described below, for example, as in the semiconductor device PKG6 which will be described later referring to FIG. 19. Alternatively, some of many high speed transmission paths SGP1 of the semiconductor device PKG1 may be structurally the same as the high speed transmission path SGP1 described below. The same is true for the semiconductor device PKG3 (see FIG. 15), semiconductor device PKG4 (see FIG. 17), and semiconductor device PKG5 (see FIG. 18).

Figure 7:
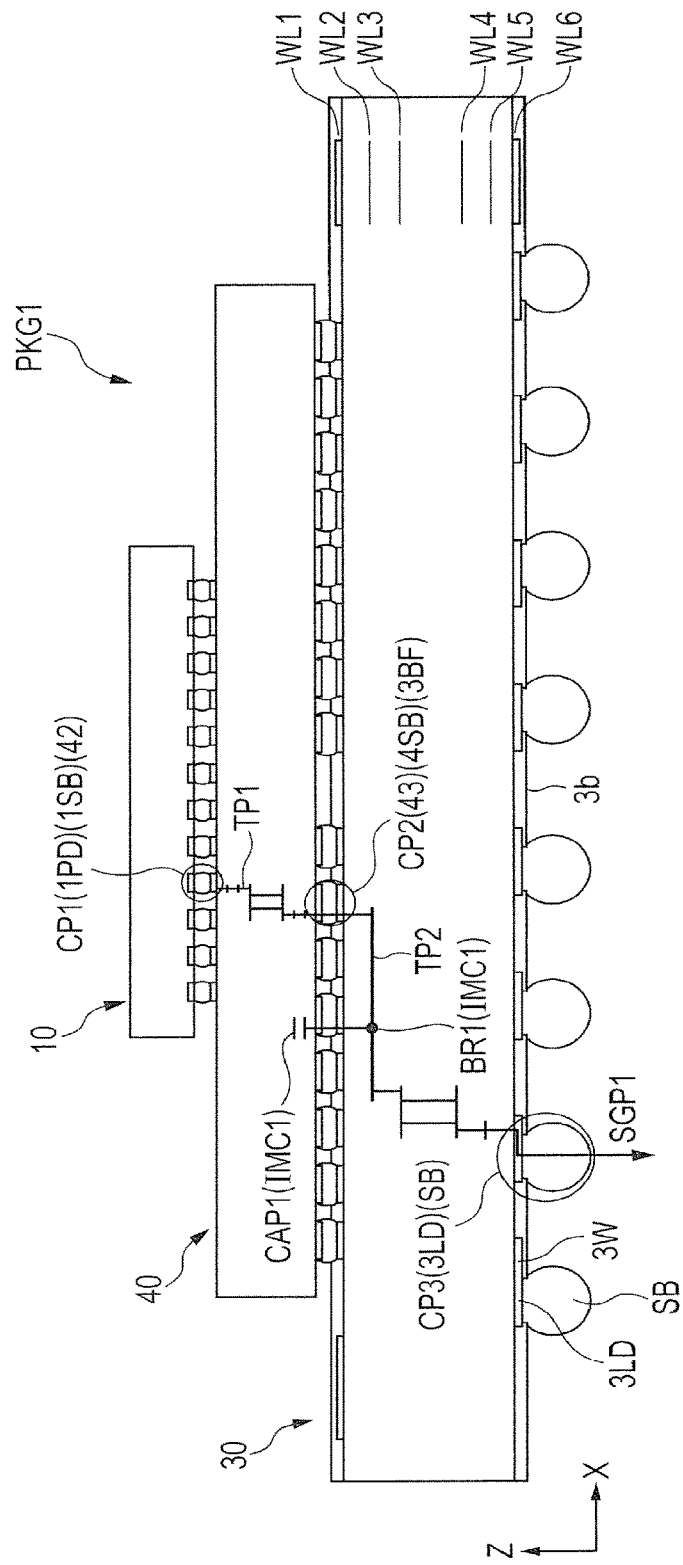
FIG. 7 schematically illustrates an example of arrangement of the high speed transmission path shown in FIG. 2 in the semiconductor device shown in FIG. 5.
Figure 8:
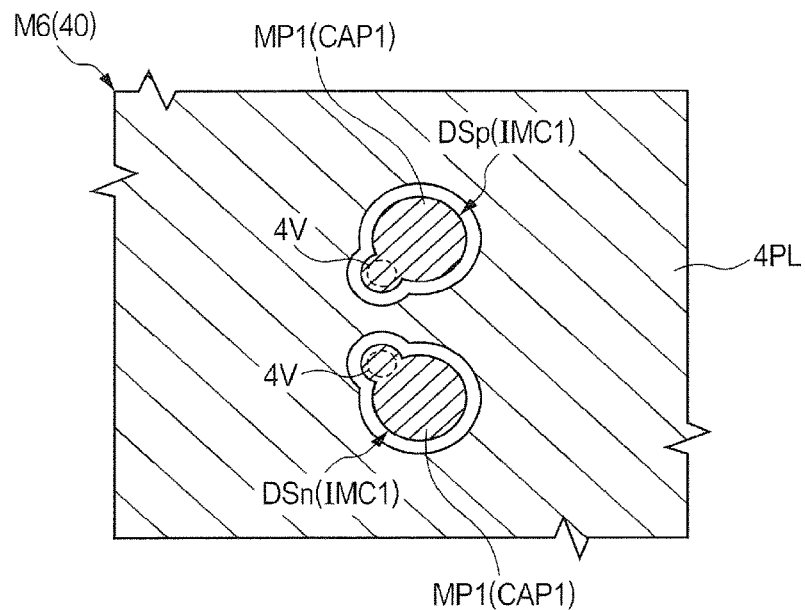
FIG. 8 is an enlarged plan view showing the conductor pattern of an electrode configuring the capacitative element shown in FIG. 7.
Figure 9:
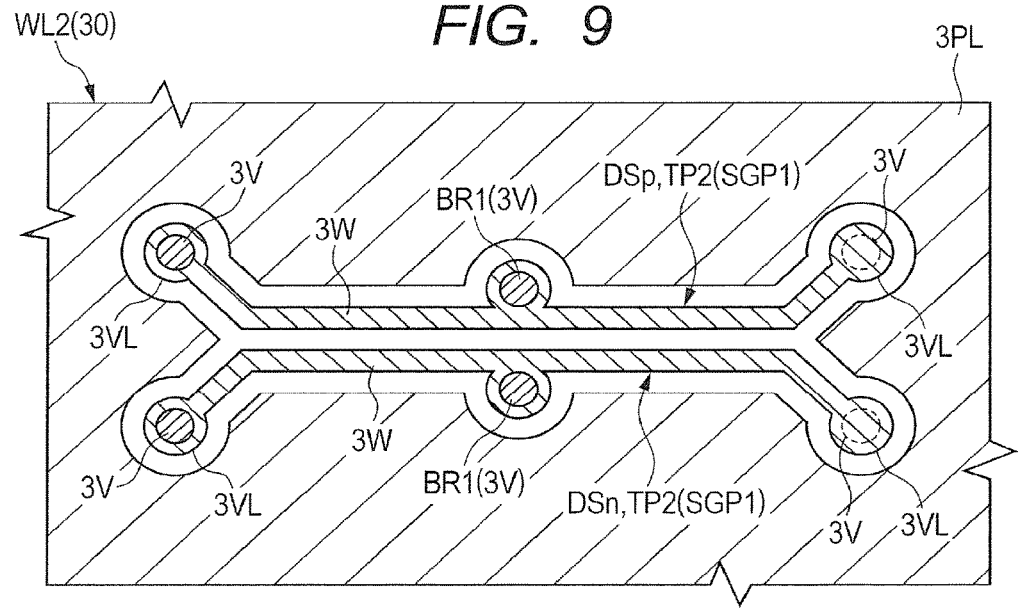
FIG. 9 is an enlarged plan view showing a branching part where the correction circuit and high speed transmission path shown in FIG. 7 are coupled, and its vicinity.
Figure 10:
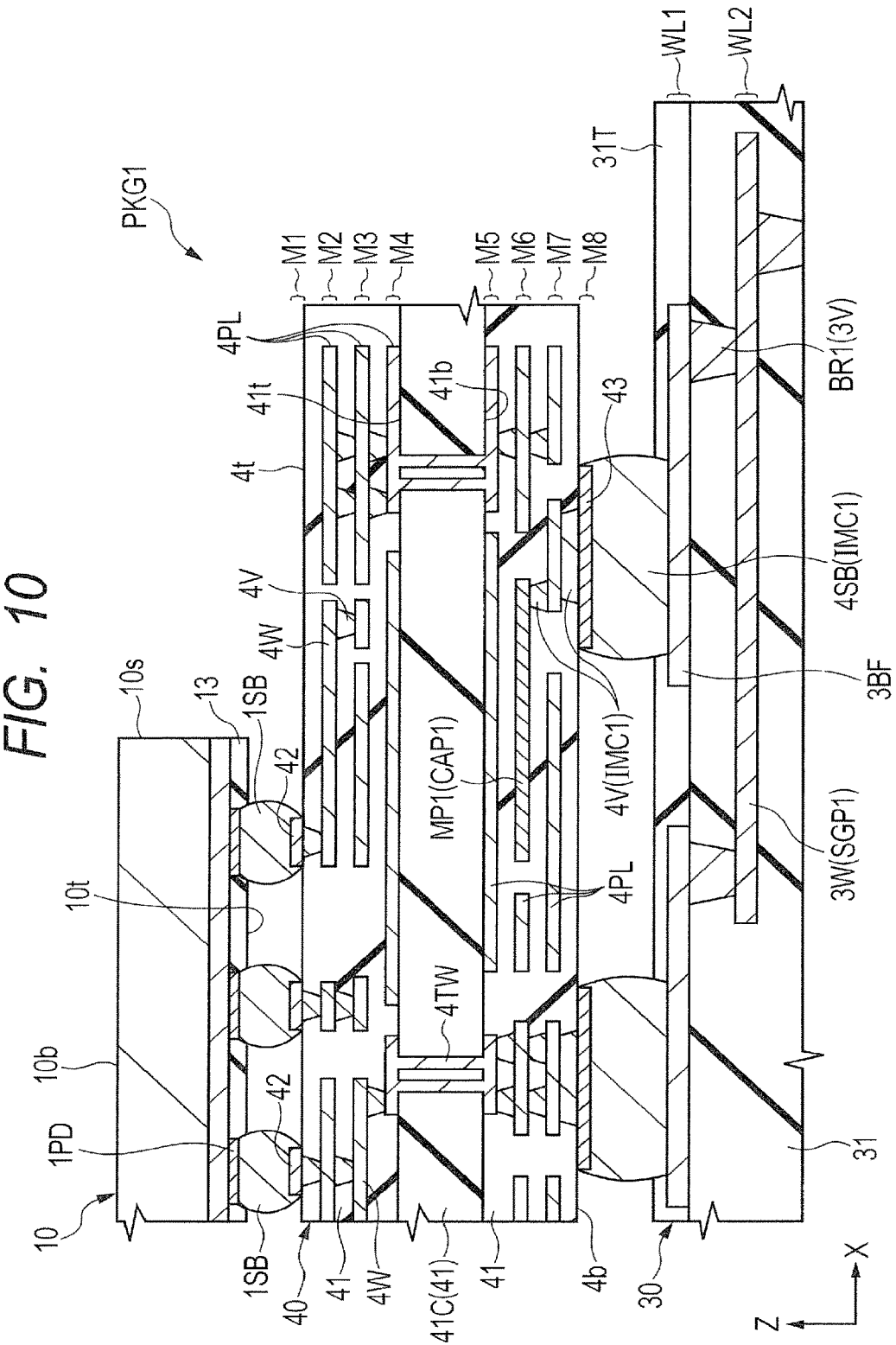
FIG. 10 is an enlarged sectional view of the correction circuit shown in FIGS. 8 and 9.
Figure 12:
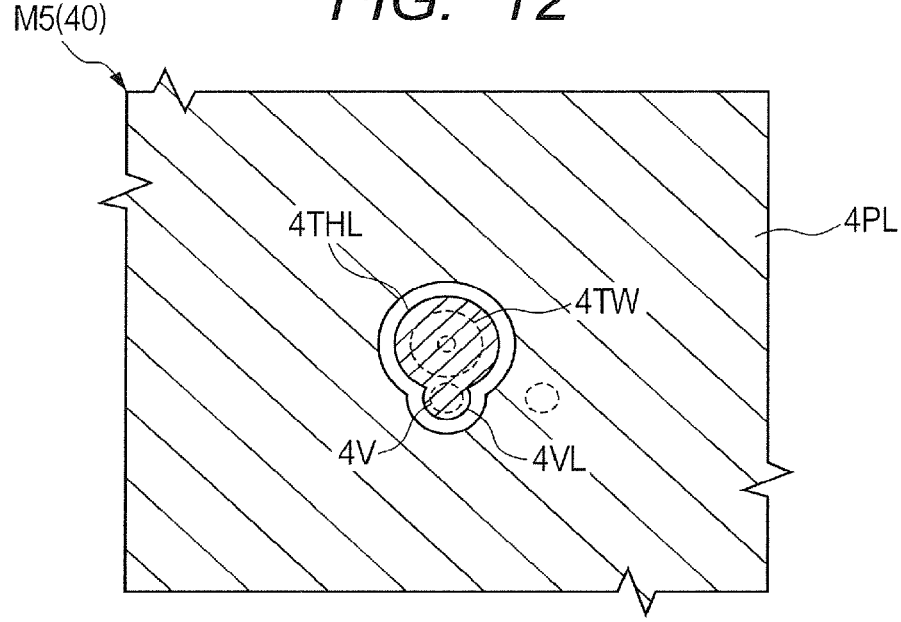
FIG. 12 is an enlarged plan view of a conductor pattern (through hole land) coupled with a through hole wiring of the interposer shown in FIG. 6 and its vicinity.

FIG. 7 schematically illustrates an example of arrangement of the high speed transmission path shown in FIG. 2 in the semiconductor device shown in FIG. 5. FIG. 8 is an enlarged plan view showing the conductor pattern of an electrode configuring the capacitative element shown in FIG. 7. FIG. 9 is an enlarged plan view showing a branching part where the correction circuit and high speed transmission path shown in FIG. 7 are coupled, and its vicinity. FIG. 10 is an enlarged sectional view of the correction circuit shown in FIGS. 8 and 9. FIG. 11 is an enlarged plan view of a conductor pattern (through hole land) coupled with a through hole wiring of the wiring substrate shown in FIG. 5 and its vicinity. FIG. 12 is an enlarged plan view of a conductor pattern (through hole land) coupled with a through hole wiring of the interposer shown in FIG. 6 and its vicinity. FIG. 20 is an enlarged plan view of the vicinity of an area where a correction circuit in a wiring substrate as a comparative example against the example shown in FIG. 9 is formed.

In FIG. 7, for easy understanding of the high speed transmission paths SGP1 and the correction circuits IMC1 coupled with the high speed transmission paths SGP1, only the wiring path for one high speed transmission path SGP1 and the correction circuit IMC1 coupled with the high speed transmission path SGP1 are shown and the other wiring paths are omitted. Although FIGS. 8, 9, 11, 12, and 20 are enlarged plan views, hatching is applied to the conductor patterns in these figures in order to show the outlines of the conductor patterns clearly. In FIGS. 8, 9, 11, 12, and 20, the outlines of via wirings 3V and 4V coupled with the lower wiring layers are indicated by dotted lines and the outlines of via wirings 3V coupled with the upper wiring layers are indicated by solid lines. In FIGS. 11 and 12, the outlines of through hole wirings 3TW and 4TW are indicated by dotted lines.

The high speed transmission paths SGP1 transmit differential signals as described earlier referring to FIG. 2. Therefore, the high speed transmission path SGP1 shown in FIG. 7 is one of the pair of differential signal transmission paths DSp and DSn shown in FIG. 2. FIGS. 8 and 9 show two differential signal transmission paths DSp and DSn which configure a differential pair. In the differential signal transmission paths, the two wiring paths configuring a differential pair extend along each other. The differential signal transmission paths DSp and DSn are mostly the same as each other in terms of shape (similar or symmetrical) as in the examples shown in FIGS. 8 and 9.

As shown in FIG. 7, the high speed transmission path SGP1 of the semiconductor device PKG1 is formed so as to couple the semiconductor chip 10 and a solder ball SB, and it is coupled with the correction circuit IMC1 in the wiring substrate 30. In the correction circuit IMC1, a branching part BR1 atone edge is coupled with the high speed transmission path SGP1 and the capacitative element CAP1 at the other edge is formed in the interposer 40.

More specifically, the high speed transmission path SGP1 has a coupling part CP1 (first coupling part) which couples the semiconductor chip 10 and the interposer 40 electrically. The coupling part CP1 includes a pad 1PD and a bump electrode 1SB of the semiconductor chip 10 and a top surface terminal 42 of the interposer 40. The high speed transmission path SGP1 also has a coupling part (second coupling part) CP2 which couples the interposer 40 and the wiring substrate 30. The coupling part CP2 includes a bottom surface terminal 43 and a bump electrode 4SB of the interposer 40 and a terminal 3BF of the wiring substrate 30. Furthermore, the high speed transmission path SGP1 has an external terminal CP3 formed on the bottom surface 3b of the wiring substrate 30. The external terminal CP3 is a coupling part which includes a land 3LD of the wiring substrate 30 and a solder ball SB. The high speed transmission path SGP1 has a transmission part (first transmission part) TP1 located in the interposer 40 to couple the coupling parts CP1 and CP2 electrically, and a transmission part (second transmission part) TP2 located in the wiring substrate 30 to couple the coupling part CP2 and the external terminal CP3 electrically. The high speed transmission path SGPT is coupled with a correction circuit (first circuit part) IMC1 in which one edge is coupled with a branching part (first branching part) BR1 located midway in the transmission part TP2 and the other edge is coupled with a capacitative element (first capacitative element) CAP1. The capacitative element CAP1 of the correction circuit IMC1 is coupled with the interposer 40.

The capacitative element CAP1 has an electrode MP1 formed in one of the wiring layers of the interposer 40 (wiring layer M6 in the example shown in FIGS. 8 and 10) as shown in FIGS. 8 and 10. A conductor plane 4PL to which a reference potential or power supply potential is supplied is formed around the electrode MP1. The capacitance of the capacitative element CAP1 is generated by capacitive coupling between the electrode MP1 and the surrounding conductor plane 4PL.

As mentioned above, in the method of improving the signal transmission characteristics using the correction circuits IMC shown in FIG. 2, a correction circuit IMC must be coupled with each of the signal transmission paths. Depending on the location of the correction circuit IMC, the number of signal transmission paths is limited due to restrictions on the planar size of the wiring substrate and the number of wiring layers. For example, if a capacitative element CAPh is formed in the wiring substrate 30h as shown in FIG. 20, the required capacitance is obtained by increasing the area of the electrode MPh of the capacitative element CAPh. The planar shape of the electrode MPh shown in FIG. 20 is almost circular and its diameter is about 220 μm. The diameter of the electrode MPh is more than twice the diameter (about 100 μm) of the part to be coupled with a via coupling 3V (via coupling land, via land 3VL). The diameter of the electrode MPh is almost the same as the area of the part to be coupled with a through hole wiring 3TW (through hole land 3THL shown in FIG. 11), among the conductor patterns formed in the wiring layer WL3 shown in FIG. 5. If several capacitative elements are coupled in one transmission path as shown in FIG. 20, the occupied area of each of the transmission paths should increase. As a consequence, the resources for the arrangement of wirings for signal transmission paths would decrease, thereby limiting the number of signal transmission paths.

Therefore, in this embodiment, capacitative elements CAP1 are formed in the interposer 40 as shown in FIG. 8 to increase the resources for the arrangement of wirings for signal transmission paths in the wiring substrate 30. In other words, in this embodiment, the electrode MP1 of a capacitative element CAP1, which has a relatively large occupied area in the correction circuit IMC1, is not formed in the wiring substrate 30. Therefore, the occupied area of the correction circuit IMC1 in the wiring substrate 30 can be decreased.

For example, as shown in FIG. 9, in the wiring substrate 30 according to this embodiment, a via wiring 3V is coupled with the branching part BR1. This via wiring 3V is a wiring path which is part of the correction circuit IMC1 (see FIG. 7) to electrically couple the capacitative element CAP1 shown in FIG. 8 and the branching part BR1 and the via wiring 3V itself need not function a capacitative element. Therefore, the area of the conductive pattern of the branching part BR1 coupled with the via wiring 3V is smaller than the area of the electrode MPh shown in FIG. 20. In the example shown in FIG. 9, the area of the conductor pattern (via land 3VL coupled with the via wiring 3V of the branching part BR1) of the branching part BR1 is almost equal to the area of the conductor pattern (via land 3VL) coupled with a via wiring 3V other than the via wiring coupled with the branching part BR1. In the example shown in FIG. 9, the planar shape of the branching part BR1 is roughly circular and its diameter is about 100 μm. In short, the area of the branching part BR1 is not more than 25% of the area of the electrode MPh shown in FIG. 20.

The occupied area of the correction circuit IMC1 in the wiring substrate 30 can be decreased even when the wiring density of the interposer 40 is equal to the wiring density of the wiring substrate 30 or the wiring density of the interposer 40 is lower than the wiring density of the wiring substrate 30. However, it is desirable to form a capacitative element CAP1 in the interposer 40 which has a relatively high wiring density for the reason explained below.

The interposer 40 has various conductor patterns including not only the wirings 4W shown in FIG. 6 but also the via wirings 4V, through hole wirings 4TW, electrodes MP1 shown in FIG. 8, and the via lands 4VL and through hole lands 4THL shown in FIG. 12. The wiring substrate 30 also has various conductor patterns including not only the wirings 3W shown in FIGS. 6 and 9 but also the via wirings 3V, via lands 3VL, through hole wirings 3TW and through hole lands 3THL shown in FIG. 11. In the above explanation, the arrangement density of conductor patterns formed in the interposer 40 or the wiring substrate 30 has been referred to as "wiring density". In the explanation given below, the abovementioned "density" will be referred to as "wiring density" or "conductor pattern arrangement density".

As described above, the wirings 4W of the interposer 40 shown in FIG. 6 are arranged at a finer pitch (smaller pitch) than the wirings 3W of the wiring substrate 30. In the example shown in FIG. 10, the width of a wiring 4W of the interposer is smaller than the width of a wiring 3W of the wiring substrate 30. In the interposer 40, the distance between adjacent conductor patterns is smaller than the distance between adjacent conductor patterns in the wiring substrate 30 in a plan view. For example, the distance between the electrode MP1 of the capacitative element CAP1 and the conductor plane (conductor pattern) 4PL surrounding the electrode MP1 as shown in FIG. 8 is smaller than the distance between the wiring 3W and the conductor plane (conductor pattern) 3PL surrounding the wiring 3W as shown in FIG. 9. In short, the arrangement density of conductor patterns formed in the interposer 40 is higher than the arrangement density of conductor patterns formed in the wiring substrate 30.

When the capacitative element CAP1 (see FIG. 7) is formed in the interposer 40 with a relatively high arrangement density of conductor patterns as in this embodiment, the distance between electrodes of the capacitative element is small and thus the required area of the electrode MP1 to get the required capacitance can be decreased. For example, in order to get the same level of capacitance as the capacitance of the capacitative element CAPh shown in FIG. 20, the area of the electrode MP1 shown in FIG. 8 has only to be one half or less of the area of the electrode MPh shown in FIG. 20. In the example shown in FIG. 8, the planar shape of the electrode MP1 is roughly circular and its diameter is about 100 μm.

As mentioned above, in this embodiment, the electrode MP1 of the capacitative element CAP1 is formed in the interposer 40 in which the arrangement density of conductor patterns is relatively high, so the occupied area of the correction circuit IMC1 can be decreased for the semiconductor device PKG1 as a whole. Therefore, even if the number of high speed transmission paths is increased, the increase in the required size of the semiconductor device PKG1 can be suppressed.

An embodiment in which the arrangement density of conductor patterns formed in the interposer 40 is higher than the arrangement density of conductor patterns in the wiring substrate 30 as mentioned above can be expressed as follows. That is, as shown in FIG. 10, the distance between adjacent wiring layers in the thickness direction among the wiring layers of the interposer 40 is shorter than the distance between adjacent wiring layers in the thickness direction among the wiring layers of the wiring substrate 30.

Referring to FIG. 10, the conductor plane 4PL facing the electrode MP1 in the thickness direction of the interposer 40 is considered as the other electrode which generates a capacitance together with the electrode MP1 or between the electrodes. Referring to FIG. 10, a capacitance is generated between the conductor plane 4PL formed in the wiring layer M5 and the electrode MP1 formed in the wiring layer M6, and between the conductor plane 4PL formed in the wiring layer M7 and the electrode MP1 formed in the wiring layer M6. If the area where the electrode MP1 and a conductor plane 4PL face each other is constant, when the distance between the wiring layers M5 and M6 or the distance between the wiring layers M6 and M7 is shorter, the capacitance value of the capacitative element CAP1 is larger. Conversely, when the distance between the wiring layers M5 and M6 or the distance between the wiring layers M6 and M7 is shorter, the capacitance value of the capacitative element CAP1 can be increased even if the area of the electrode MP1 is small. In short, since the distance between adjacent wiring layers in the thickness direction among the wiring layers of the interposer 40 is shorter than the distance between adjacent wiring layers in the thickness direction among the wiring layers of the wiring substrate 30, the area of the electrode MP1 can be decreased. When the area of the electrode MP1 is decreased, the increase in the required size of the semiconductor device PKG1 can be suppressed even if the number of high speed transmission paths is increased.

Another approach to the above method of forming the capacitative element CAP1 in the interposer 40 according to this embodiment may be to form the branching part BR1 shown in FIG. 7 in the interposer 40. In this case, the occupied area of the correction circuit IMC1 in the wiring substrate 30 can be decreased.

However, since the sectional area of a wiring 4W of the interposer 40 with a relatively high arrangement density of conductor patterns is smaller than that of a wiring 3W of the wiring substrate 30, the resistance of the wiring 4W is large. For this reason, when the wiring path distance of the signal transmission path in the interposer 40 is longer, loss attributable to a large wiring resistance (insertion loss) is larger. Therefore, from the viewpoint of decreasing such insertion loss, it is desirable to shorten the wiring path distance of the high speed transmission path SGP1 in the interposer 40.

In this embodiment, as shown in FIG. 7, the branching part BR1 at which the correction circuit IMC1 and the high speed transmission path SGP1 are coupled is formed in the wiring substrate 30. Specifically, in this embodiment, the high speed transmission path SGP1 is led to the wiring substrate 30 through a transmission part TP1 and branched into the correction circuit IMC1 and the high speed transmission path SGP1 midway in a transmission part TP2 of the wiring substrate 30. This means that the wiring path distance of the transmission part TP1 can be short. In the example shown in FIG. 7, the wiring path distance of the transmission part TP1 is shorter than the wiring path distance of the transmission part TP2. Insertion loss can be thus reduced by shortening the wiring path distance of the transmission part TP1 formed in the interposer 40 with a relatively high arrangement density of conductor patterns.

In this embodiment, as shown in FIG. 7, the branching part BR1 at which the correction circuit IMC1 and the high speed transmission path SGPT are coupled is formed in the wiring layer WL2 among the wiring layers of the wiring substrate 30. When the branching part BR1 is formed somewhere at least in the wiring substrate 30, insertion loss can be reduced as mentioned above. Therefore, as a variation of this embodiment, the branching part BR1 may be formed in one of the wiring layers WL1, WL3, WL4, WL5, and WL6 shown in FIG. 7.

However, when the wiring substrate 30 has a through hole wiring 3TW penetrating the insulating layer 31C as the core insulating layer in the thickness direction like the wiring substrate 30 in this embodiment as shown in FIG. 5, the through hole wiring 3TW is coupled with through hole lands 3THL (see FIG. 11) as large conductor patterns in the wiring layers WL3 and WL4. The area of the through hole land 3THL shown in FIG. 11 is larger than the area of the via land 3VL shown in FIG. 9, for example, four times larger or more. The parasitic capacitance generated between this large through hole land 3THL and the surrounding conductor plane 3PL is large. For this reason, when the through hole land 3THL is included midway in the correction circuit IMC1 shown in FIG. 7, the influence of signal reflection by the through hole land 3THL must be taken into consideration.

Therefore, for the purpose of facilitating control for impedance matching by the correction circuit IMC1, it is desirable that the branching part BR1 at which the correction circuit IMC1 and the high transmission path SGPT are coupled be formed in one of the wiring layers between the insulating layer 31C and the top surface 3t as shown in FIG. 5, namely one of the wiring layers WL1, WL2, and WL3. As shown in FIG. 5, the terminals 3BF of the wiring substrate 30 are formed in the wiring layer WL1. Therefore, in order to facilitate the arrangement of the wirings 3W for coupling the branching part BR1 and the via wiring 3V as shown in FIG. 9, it is desirable to form the branching part BR1 in the wiring layer WL2 or WL3 shown in FIG. 5.

In the example according to this embodiment, as shown in FIG. 10, the electrode MP1 configuring part of the capacitative element CAP1 located at one edge of the correction circuit IMC1 is formed in the wiring layer M6 among the wiring layers of the interposer 40. If the electrode MP1 is formed somewhere at least in the interposer 40, the occupied area of the correction circuit IMC1 in the wiring substrate 30 can be decreased as mentioned above. Therefore, as a variation of this embodiment, the electrode MP1 may be formed in one of the wiring layers M1, M2, M3, M4, M5, M7, and M8.

However, a plurality of top surface terminals 42 are formed in the wiring layer M1 and a plurality of bottom surface terminals 43 are formed in the wiring layer M8. Therefore, in order to increase the freedom in the arrangement of the electrode MP1, it is desirable to form the electrode MP1 in one of the wiring layers between the wiring layers M1 and M8.

If the interposer 40 has a through hole wiring 4TW penetrating the insulating layer 41C as the core insulating layer in the thickness direction as shown in FIG. 10 like the interposer 40 according to this embodiment, the through hole wiring 4TW is coupled with the through hole lands 4THL (see FIG. 12) as large conductor patterns in the wiring layers M4 and M5. The area of the through hole land 4THL shown in FIG. 12 is smaller than the area of the through hole land 3THL shown in FIG. 11 and its diameter is, for example, about 100 μm. Therefore, from the viewpoint of the ease of control for impedance matching of the high speed transmission path SGPT by the correction circuit IMC1, it is desirable that the through hole land 4THL be not included midway in the correction circuit IMC1.

Therefore, from the viewpoint of the ease of control for impedance matching by the correction circuit IMC1, it is desirable that the electrode MP1 configuring the capacitative element CAP1 be formed in a wiring layer between the insulating layer 41C and bottom surface 4b shown in FIG. 10, namely one of the wiring layers M5, M6, M7, and M8.

On the other hand, if the required capacitance for impedance matching is large, the parasitic capacitance of the through hole land 4THL (see FIG. 12) may be used as an auxiliary capacitance for impedance matching. For example, if the electrode MP1 shown in FIG. 10 is formed in a wiring layer between the insulating layer 41C and top surface 4t, namely one of the wiring layers M1, M2, M3, and M4, two or more through hole lands 4THL are inserted in the wiring path of the correction circuit IMC1.

Figure 13:
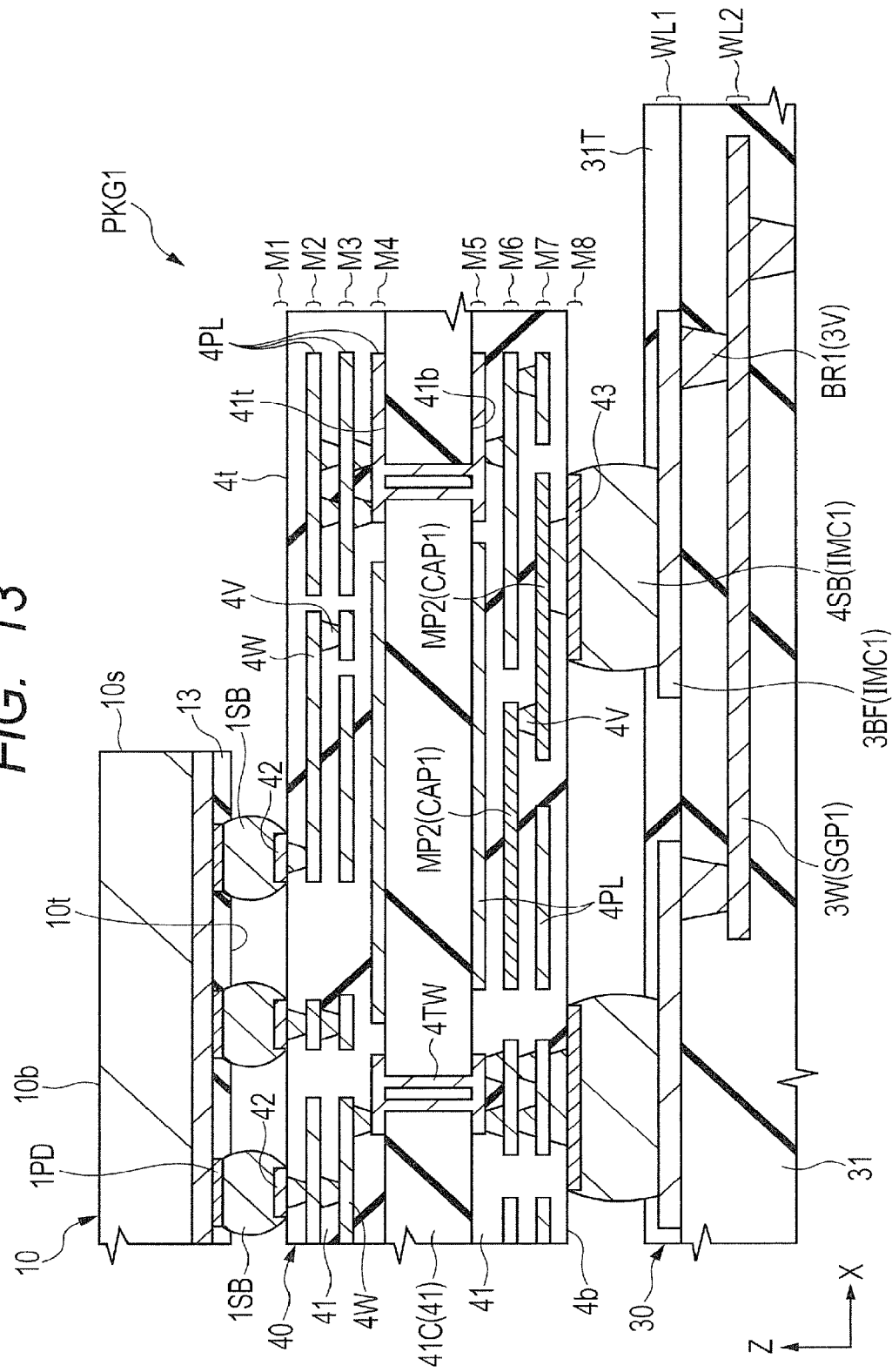
FIG. 13 is an enlarged sectional view showing a variation of the example shown in FIG. 10.

If the required capacitance for impedance matching is large, the electrode MP2 configuring part of the capacitative element CAP1 may be formed by electrically coupling conductor patterns formed in a plurality of wiring layers through via wirings 4V like the electrode MP2 shown in FIG. 13 as a variation. FIG. 13 is an enlarged sectional view showing a variation of the example shown in FIG. 10. Since the area of the electrode MP2 shown in FIG. 13 is larger than the area of the electrode MP1 shown in FIG. 10, the capacitance value of the capacitative element CAP1 can be increased. Furthermore, since the electrode MP2 is formed in a manner to stretch over both the wiring layers M6 and M7, the increase in the occupied area of the electrode MP2 in each wiring layer can be suppressed. This increases the freedom in the arrangement of wirings in the wiring layers.

As explained above referring to FIG. 8, in this embodiment, the electrode MP1 configuring the capacitative element CAP1 is roughly circular (part of the circular electrode MP1 overlaps part of the circular via land 4VL). A non-linear conductor pattern as shown in FIG. 8 may be expressed as follows in comparison with a linearly extending long narrow conductor pattern such as a wiring. That is, the electrode MP1 is a conductor pattern which has a larger width than the width of the wiring 3W configuring the transmission part TP2 of the wiring substrate 30 as shown in FIG. 9. Also, the electrode MP1 has a larger width than the width of a wiring 4W (see FIG. 10) of the interposer 40.

Figure 14:
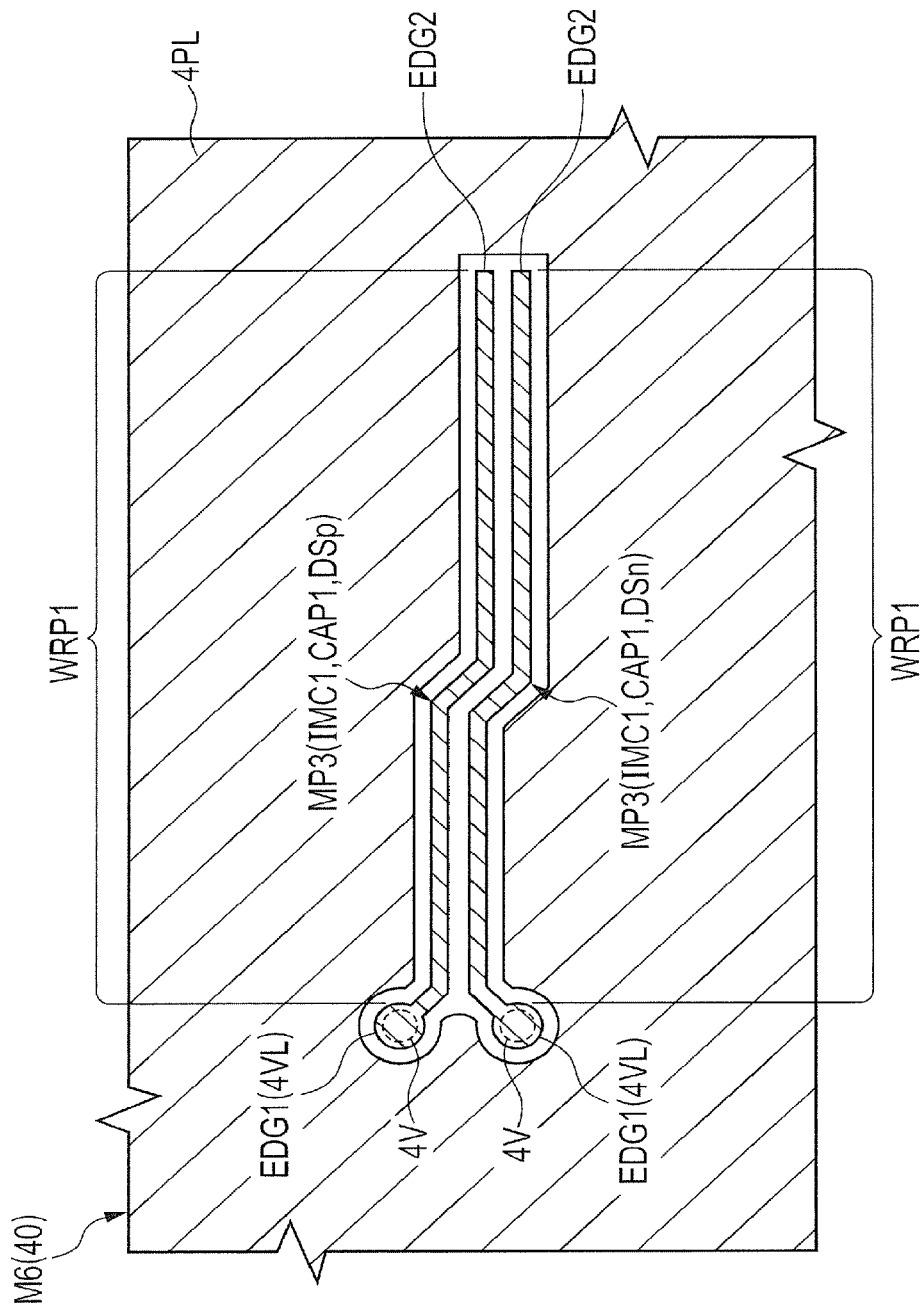
FIG. 14 is an enlarged plan view showing the conductor pattern of an electrode configuring a capacitative element as a variation of the example shown in FIG. 8.

The electrode MP1 may take other various shapes. For example, the electrode MP3 as a linearly extending conductor pattern like the one shown in FIG. 14 may replace the above electrode MP1. FIG. 14 is an enlarged plan view showing the conductor pattern of the electrode configuring a capacitative element as a variation of the electrode shown in FIG. 8. Even in the case of a linearly extending conductor pattern like the electrode MP3 shown in FIG. 14, a capacitance is generated depending on the area of conductor patterns facing each other through a dielectric (for example, the insulating layer 41 shown in FIG. 10). If the electrode MP1 is a linearly extending conductor pattern, it is desirable that one edge of the conductor pattern be terminated while isolated from other conductor patterns.

The electrode MP3 shown in FIG. 14 may be described as follows. That is, the electrode MP3 has an edge (first edge) EDG1 located on the side of the branching part BR1 (see FIG. 7) in the correction circuit IMC1. The electrode MP3 also has an edge EDG2 which is opposite to the edge EDG1 and spaced from conductor patterns other than the electrode MP3. The electrode MP3 also has an extending part WRP1 which couples the edges EDG1 and EDG2.

The width of the extending part WRP1 (length in the direction perpendicular to the extending direction) is not limited. In the example shown in FIG. 14, it is not larger than the width of the wiring 3W shown in FIG. 9. Even when the width of the extending part WRP1 is small like this, if the length of the extending part WRP1 is sufficient, the capacitance value can be increased.

If the capacitative element CAP1 is formed as a long narrow conductor pattern like the electrode MP3, the extending part WRP1 may have a bent portion as shown in FIG. 14 (although FIG. 14 shows that it has a bent portion, it may have a curved portion). Since the middle portion of the extending part WRP1 can be bent, when many correction circuits IMC1 are arranged, the freedom in the arrangement of correction circuits IMC1 is higher than when the electrode MP1 shown in FIG. 8 is used. In the electrode MP3, the extending part WRP1 may have a bent middle portion as shown in FIG. 14, but instead the extending part WRP1 may be straight without any bent portion, though not shown.

This embodiment has been described with focus on the high speed transmission path SGPT for transmitting a differential signal, as shown in FIG. 2. In the example shown in FIG. 14, the correction circuit IMC1 coupled with the differential signal transmission path DSp and the correction circuit IMC1 coupled with the differential signal transmission path DSn extend along each other. As shown in FIG. 14, if the extending part WRP1 of the electrode MP3 coupled with the differential signal transmission path DSp has a bent portion, the extending part WRP1 of the electrode MP3 coupled with the other differential signal transmission path DSn may similarly have a bent portion. However, the correction circuits IMC1 need not extend along each other like the differential signal transmission paths DSn and DSp, provided that the required capacitative element can be formed. For example, a wiring to supply a reference potential may be provided between the correction circuit IMC1 coupled with the differential signal transmission path DSp and the correction circuit IMC1 coupled with the differential signal transmission path DSn, though not shown. Alternatively, the correction circuit IMC1 coupled with the differential signal transmission path DSp and the correction circuit IMC1 coupled with the differential signal transmission path DSn may extend in different directions.

As shown in FIG. 7, the correction circuit IMC1 coupled with the high speed transmission path SGP1 is led to the wiring substrate 30 through the transmission part TP1 and the correction circuit IMC1 branches off from the high speed transmission path SGP1 midway in the transmission part TP2 of the wiring substrate 30. Consequently, the wiring path distance of the high speed transmission path SGP1 in the interposer 40, which has a relatively high wiring resistance, is shortened.

However, in order to increase the number of high speed transmission paths SGP1 shown in FIG. 2, there may be a case that wirings for some of many high speed transmission paths must be arranged inside the interposer 40 shown in FIG. 6. If that is the case, in a high speed transmission path with a long wiring path distance inside the interposer 40, signal reflection at the terminal end of the input/output element or at the capacitative element of the correction circuit IMC would be untimely depending on the time constant determined by the product (CR) of capacitance component (C) and resistance component (R) of the wiring path. More specifically, in the interposer 40, the sectional area of a wiring 4W (see FIG. 6) would be smaller than the sectional area of a wiring 3W (see FIG. 6) in the wiring substrate 30 and thus the wiring resistance would be larger, thereby causing a delay in timing of signal reflection. Therefore, the distance from the capacitative element for impedance matching to the terminal end of the input/output element must be shortened.

Figure 15:
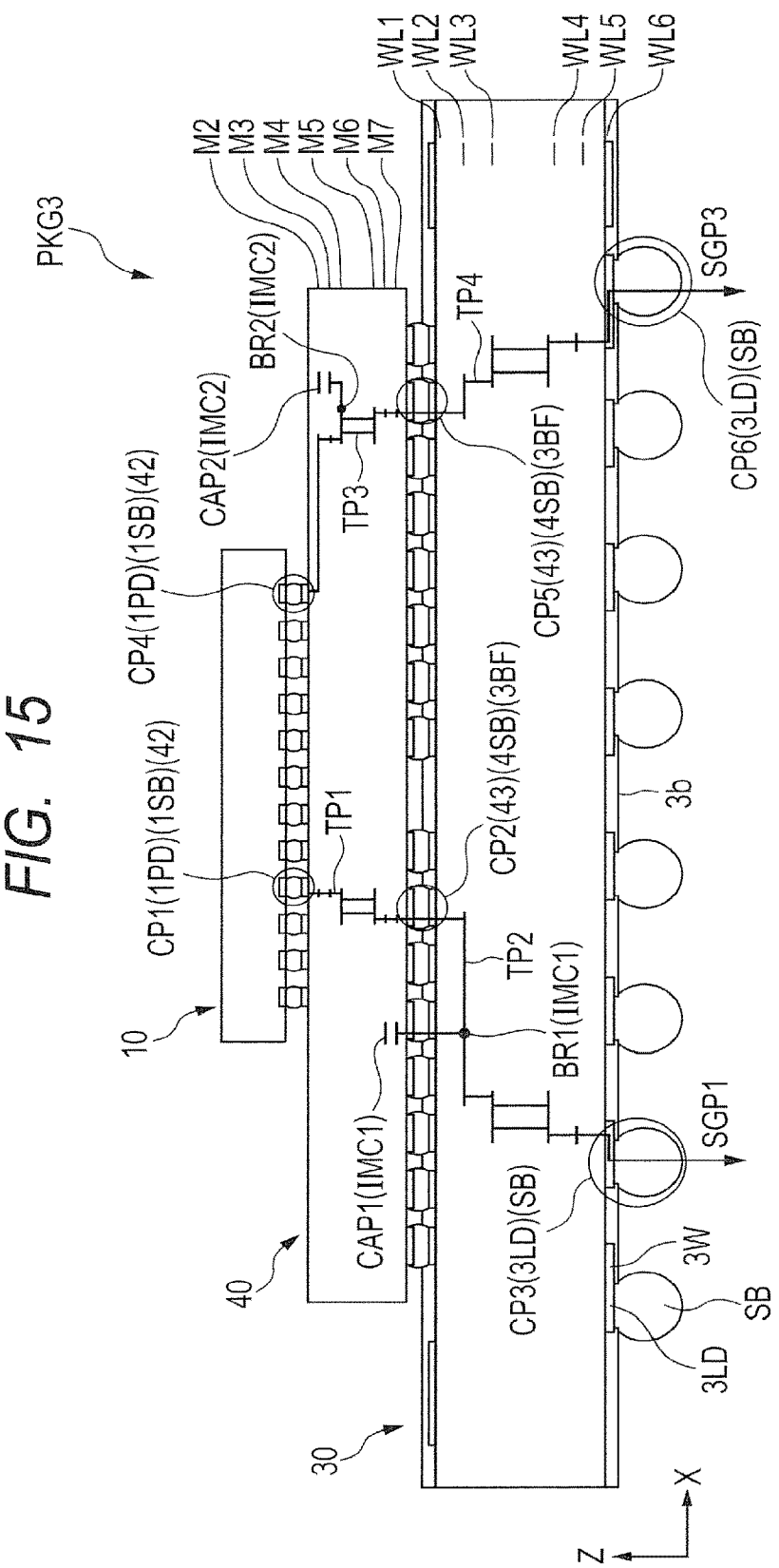
FIG. 15 schematically illustrates an example of arrangement of high speed transmission paths in a semiconductor device as a variation of the example shown in FIG. 7.

Therefore, some of the high speed transmission paths may be coupled with a capacitative element CAP2 in the interposer 40 as in the variation shown in FIG. 15. FIG. 15 schematically illustrates an example of arrangement of high speed transmission paths in a semiconductor device as a variation of the example shown in FIG. 7. The semiconductor device PKG3 shown in FIG. 15 is different from the semiconductor device PKG1 shown in FIG. 7 in that some of the high speed transmission paths are coupled with the capacitative element CAP2 of the correction circuit IMC2 in the interposer 40. The correction circuit IMC2 coupled with a high speed transmission path SGP3 shown in FIG. 15 is different from the correction circuit IMC1 in that it is not formed in the wiring substrate 30 but it is coupled in the interposer 40.

More specifically, the semiconductor device PKG3 has a high speed transmission path SGP3 coupled with the semiconductor chip 10 in addition to the high speed transmission path SGPT described above referring to FIG. 7. The high speed transmission path SGP3 has a coupling part CP4 (third coupling part) which couples the semiconductor chip 10 and the interposer 40 electrically. The coupling part CP4 includes a pad 1PD and a bump electrode 1SB of the semiconductor chip 10 and a top surface terminal 42 of the interposer 40. The high speed transmission path SGP3 also has a coupling part (fourth coupling part) CP5 which couples the interposer 40 and the wiring substrate 30. The coupling part CP5 includes a bottom surface terminal 43 and a bump electrode 4SB of the interposer 40 and a terminal 3BF of the wiring substrate 30. Furthermore, the high speed transmission path SGP3 has an external terminal CP6 formed on the bottom surface 3b of the wiring substrate 30. The external terminal CP6 is a coupling part which includes a land 3LD of the wiring substrate 30 and a solder ball SB. The high speed transmission path SGP3 has a transmission part (third transmission part) TP3 located in the interposer 40 to couple the coupling parts CP4 and CP5 electrically, and a transmission part (fourth transmission part) TP4 located in the wiring substrate 30 to couple the coupling part CP5 and the external terminal part CP6 electrically. The high speed transmission path SGP3 is coupled with a correction circuit (second circuit part) IMC2 in which one edge is coupled with a branching part (second branching part) BR2 located midway in the transmission part TP3 and the other edge is coupled with a capacitative element (second capacitative element) CAP2. The capacitative element CAP2 of the correction circuit IMC2 is coupled with the interposer 40.

The wiring path distance of the transmission part TP3 shown in FIG. 15 is longer than the wiring path distance of the transmission part TP1. Therefore, in the high speed transmission path SGP3, signal loss (insertion loss) attributable to a wiring resistance is larger than in the high speed transmission path SGP1. From the viewpoint of reducing signal loss in the semiconductor device PKG3, it is desirable that the overall wiring path distance of the high speed transmission path SGP3 be shorter than that of the high speed transmission path SGP1. In the example shown in FIG. 15, the wiring path distance of the transmission part TP4 is shorter than the wiring path distance of the transmission part TP2. The sum of the wiring path distances of the transmission parts TP3 and TP4 is shorter than the sum of the transmission path distances of the transmission parts TP1 and TP2. Consequently, insertion loss in the high speed transmission path SGP3 as a whole can be reduced.

The semiconductor device PKG3 has a plurality of high speed transmission paths SGP1 and a plurality of high speed transmission paths SGP3, though not shown. In this case, it is desirable that the number of high speed transmission paths SGP1, in which insertion loss is smaller, be larger than the number of high speed transmission paths SGP3.

Figure 16:
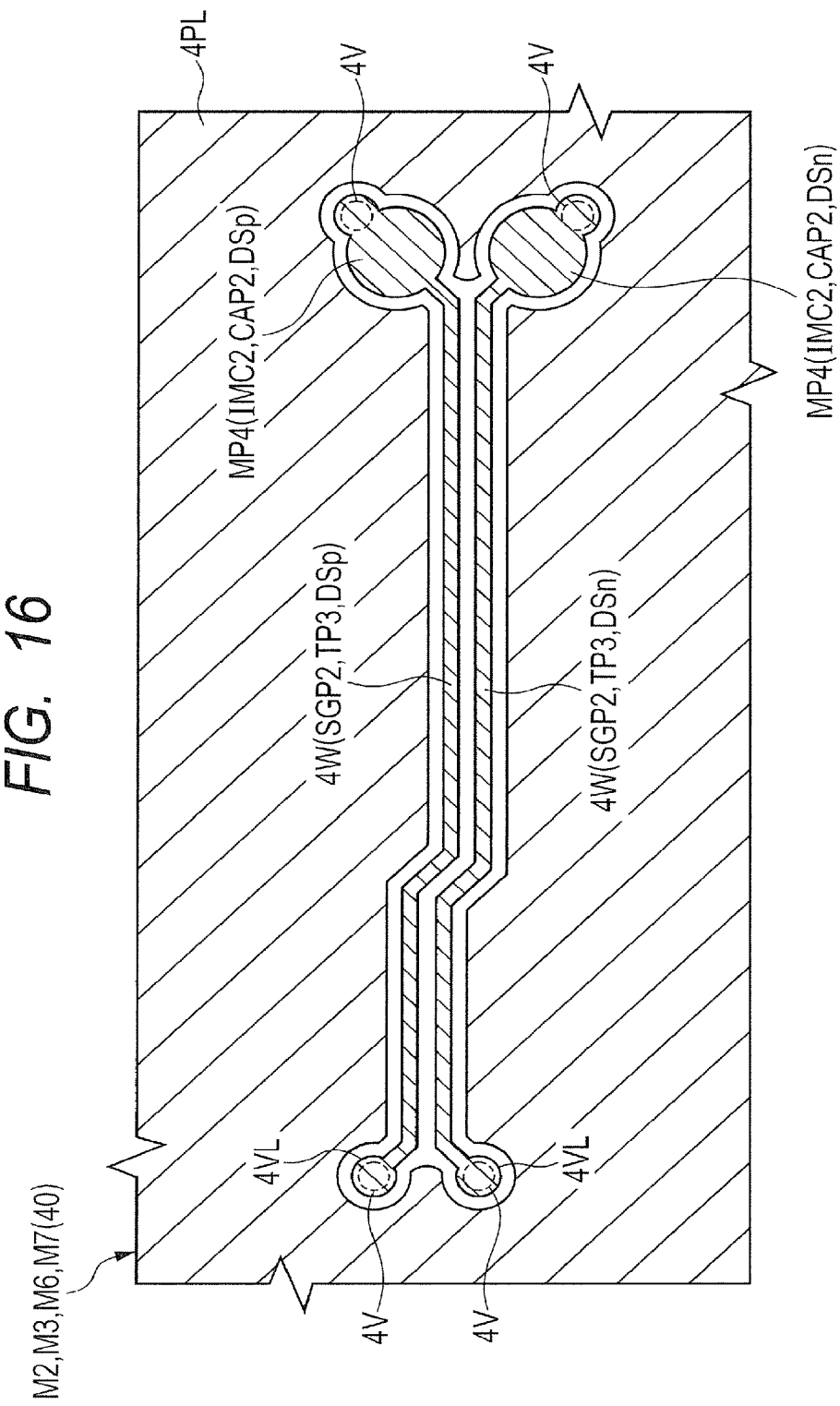
FIG. 16 is an enlarged plan view showing a variation of the correction circuit shown in FIG. 15.

In order to indicate clearly that the correction circuit IMC2 is coupled with a middle portion of the transmission part TP3, FIG. 15 shows an embodiment in which the correction circuit IMC2 branches off at the branching part BR2. However, if the whole correction circuit IMC2 is formed in the interposer 40, the high speed transmission path SGP3 and the correction circuit IMC2 need not be separated from each other. For example, an electrode MP4 configuring part of the capacitative element CAP2 may be inserted midway in the transmission part TP3 as shown in FIG. 16. Also, the variation shown in FIG. 15 and the variation shown in FIG. 14 may be combined, though not shown. Specifically, a linearly extending conductor pattern like the electrode MP2 shown in FIG. 14 may be used for the electrode of the capacitative element CAP2 shown in FIG. 15.

Figure 17:
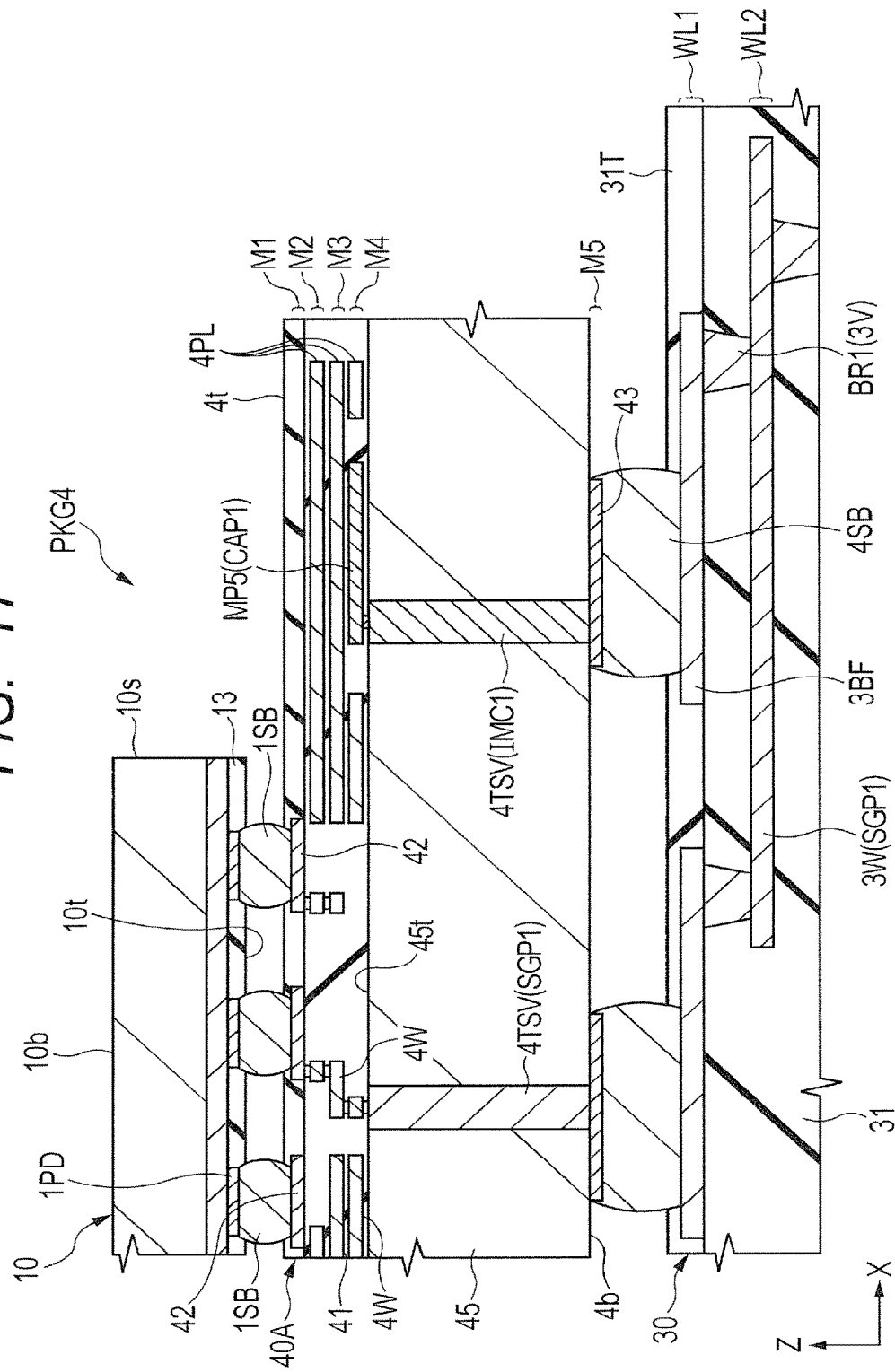
FIG. 17 is an enlarged sectional view showing a variation of the example shown in FIG. 10.
Figure 18:
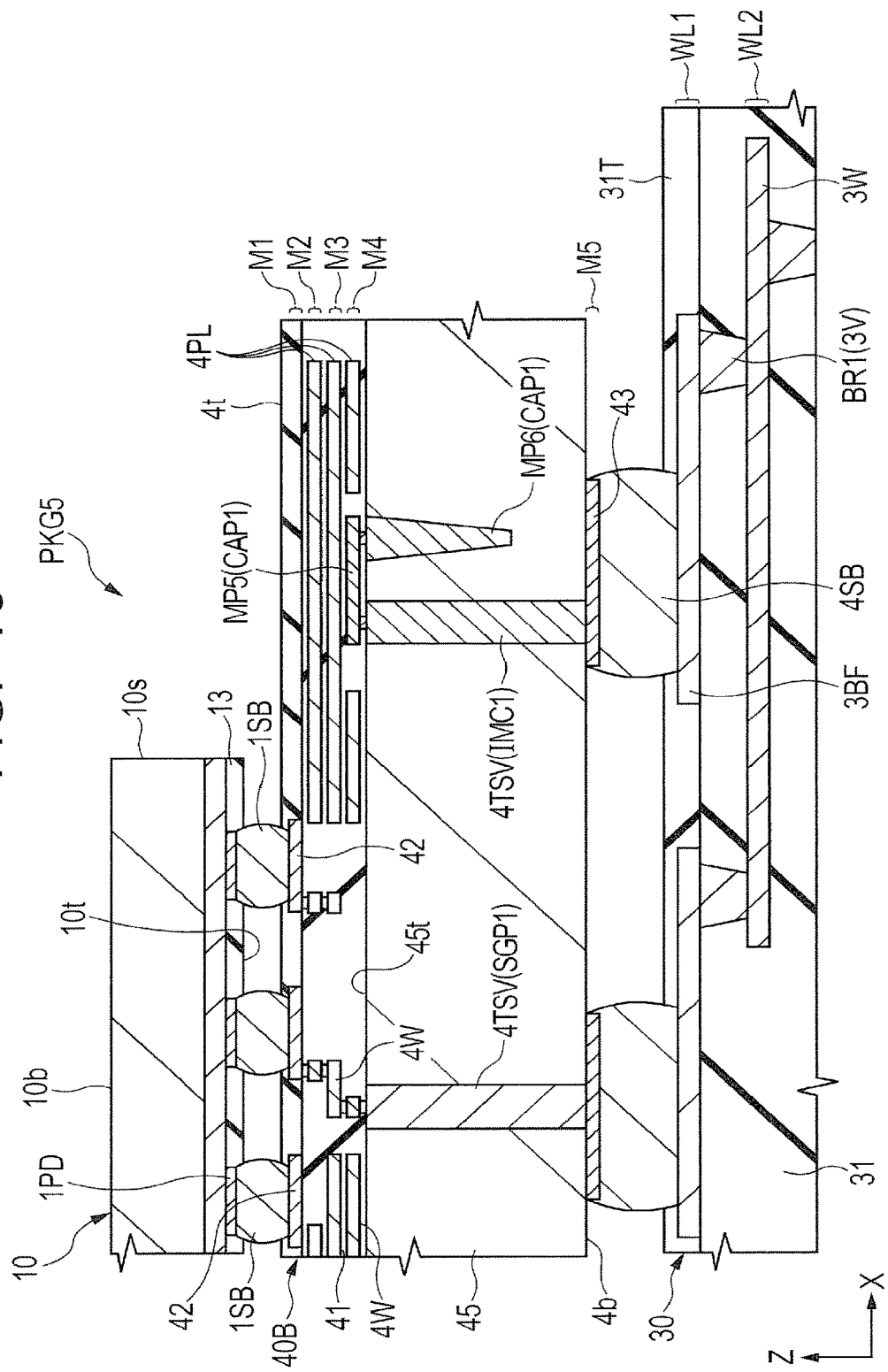
FIG. 18 is an enlarged sectional view showing a variation of the example shown in FIG. 17.

FIG. 10 shows an embodiment which uses the interposer 40 having an insulating layer 41C as a core insulating layer. As a variation of the example in FIG. 10, like the semiconductor device PKG4 shown in FIG. 17, the semiconductor device may have an interposer 40A which uses a semiconductor substrate as abase material. FIG. 17 is an enlarged sectional view showing a variation of the example shown in FIG. 10. FIG. 18 is an enlarged sectional view showing a variation of the example shown in FIG. 17.

The interposer 40A of the semiconductor device PKG4 shown in FIG. 17 is different from the interposer 40 shown in FIG. 10 in that it has a substrate (semiconductor substrate, base material) 45 with a main surface 45t and a plurality of through electrodes 4TSV penetrating the substrate 45 in the thickness direction. Also, the interposer 40A is different from the interposer 40 in that it does not have the insulating layer 41C and through hole wirings 4TW as shown in FIG. 10.

The substrate 45 of the interposer 40A is a semiconductor base material and in this embodiment, it is, for example, made of silicon (Si). A substrate made of silicon may be called a silicon substrate. A silicon substrate is widely used in semiconductor wafer manufacturing processes. Wiring layers M1, M2, M3, and M4 which are stacked over the substrate 45 are formed using the technique to make a circuit by stacking wiring layers over a semiconductor wafer. For this reason, conductor patterns including a plurality of wirings 4W for the wiring layers M1, M2, M3, and M4 are formed at a finer pitch (smaller pitch) than in the wiring substrate 30.

The interposer 40A has a plurality of through electrodes 4TSV penetrating the substrate 45 in the thickness direction (direction from one of the main surface 45t and the bottom surface 4b to the other surface). The through electrodes 4TSV are conduction paths which are formed by burying conductor such as copper (Cu) in the through holes penetrating the substrate in the thickness direction. In each of the through electrodes 4TSV, one edge is coupled with a bottom surface terminal 43 and the other edge is coupled with a top surface terminal 42 through the wirings 4W in the wiring layers M2, M3, and M4.

FIG. 17 shows an embodiment in which the capacitive element CAP1 described above referring to FIG. 7 is located in the interposer 40A which uses a semiconductor substrate. In the example shown in FIG. 17, a conductor pattern (first conductor pattern) for one electrode MP5 of the capacitative element CAP1 is formed in one of the wiring layers stacked between the substrate 45 and the top surface 4t of the interposer 40A (wiring layer M4 in the example shown in FIG. 17). The electrode MP5 may have the same shape as the electrode MP1 shown in FIG. 8 or the electrode MP3 shown in FIG. 14. The capacitance of the capacitative element CAP1 is generated by capacitive coupling between the conductor pattern surrounding the electrode MP5 in a plan view (in the example shown in FIG. 17, the conductor plane 4PL in the wiring layer M4) and the electrode MP5. Also, the capacitance of the capacitative element CAP1 is generated by capacitive coupling between the conductor pattern overlapping the electrode MP5 in the thickness direction (in the example shown in FIG. 17, the conductor plane 4PL in the wiring layer M3) and the electrode MP5.

The electrode MP5 is electrically coupled with the high speed transmission path SGP1 (branching part BR1) through some of the through electrodes 4TSV (first through electrode) of the interposer 40A. In other words, the capacitative element CAP1 of the correction circuit IMC1 is electrically coupled with the high speed transmission path SGP1 (branching part BR1) through some of the through electrodes 4TSV (first through electrode) of the interposer 40A. The capacitative element CAP1 of the correction circuit IMC1 includes an electrode (first conductor pattern) MP5 formed in a wiring layer located between the main surface 45t of the substrate 45 and the top surface 4t of the interposer 40A.

In the example shown in FIG. 17, the electrode MP5 is formed in the wiring layer M4; however, instead the electrode MP5 may be formed in the wiring layer M2 or M3. Although the electrode MP5 may be formed in the wiring layer M1, a plurality of top surface terminals 42 are formed in the wiring layer M1 and from the viewpoint of increasing the freedom in the arrangement of the electrode MP5, it is desirable to form the electrode MP5 in one of the wiring layers M2, M3, and M4. Like the electrode MP2 described above referring to FIG. 13, the electrodes MP5 shown in FIG. 17 may be formed in several wiring layers and coupled with each other through via wirings 4V (see FIG. 13). Since a plurality of bottom surface terminals 43 are formed in the wiring layer M5 among the wiring layers of the interposer 40A, if the electrode MP5 is formed in the wiring layer M5, it would be difficult to generate a sufficient capacitance.

The embodiment shown in FIG. 18 includes a further variation of the arrangement of the capacitative element CAP1 shown in FIG. 17. The interposer 40B of the semiconductor device PKG5 shown in FIG. 18 is different from the interposer 40A of the semiconductor device PKG4 shown in FIG. 17 in that it has a conductor pattern MP6 extending from the main surface 45t of the substrate 45 toward the bottom surface 4b. The elements of the semiconductor device PKG5 other than the above are the same as those of the semiconductor device PKG4 shown in FIG. 17 and their descriptions are omitted.

The conductor pattern MP6 of the interposer 40B shown in FIG. 18 functions as an electrode of the capacitative element CAP1. The substrate 45 is prepared by doping a semiconductor material as abase material with impurities and it has a p-type (positive type) or n-type (negative type) conduction characteristic attributable to the impurities. When a conductor material such as metal is buried in a semiconductor substrate doped with impurities, a parasitic capacitance is generated between the conductor material and the substrate 45. For this reason, a parasitic capacitance is generated between the conductor pattern MP6 of the interposer 40B shown in FIG. 18 and the substrate 45 and this parasitic capacitance can be used as part of the capacitative element CAP1 of the correction circuit IMC1. The use of the conductor pattern MP6 as part of the capacitative element CAP1 like this embodiment is particularly effective when it is difficult to increase the area of the electrode MP5.

The conductor pattern MP6 is electrically coupled with the high speed transmission path SGPT (branching part BR1) through the electrode MP5 (which may function as a wiring 4W). Consequently, the conductor pattern MP6 can be used as part of the capacitative element CAP1 located at one edge of the correction circuit IMC1. In other words, the capacitative element CAP1 of the correction circuit IMC1 includes the conductor pattern MP6 which extends from the main surface 45t of the substrate 45 toward the bottom surface 4b of the interposer 40B and it is electrically coupled with the high speed transmission path SGPT through the electrode MP5.

Among a plurality of through electrodes 4TSV shown in FIG. 18, the through electrode 4TSV which is part of the correction circuit IMC1 functions as part of the capacitative element CAP1 like the conductor pattern MP6. However, since the through electrode 4TSV must be coupled at least with a bottom surface terminal 43, like the conductor pattern MP6, it is almost impossible to terminate it midway between the main surface 45t of the substrate and the bottom surface 4b. Therefore, from the viewpoint of controlling the capacitance of the capacitative element CAP1, it is desirable to use the electrode MP5 or conductor pattern MP6 for the capacitative element CAP1.

If the conductor pattern MP6 functions as part of the capacitative element CAP1, the larger the depth of the conductor pattern MP6 (length in the direction from the main surface 45t to the bottom surface 4b) is, the better it is. In the example shown in FIG. 18, the length of the conductor pattern MP6 is half or more the thickness of the substrate 45 (distance from the main surface 45t to the bottom surface 4b). In other words, the tip of the conductor pattern MP6 is closer to the bottom surface 4b of the interposer 40B than to the main surface 45t of the substrate 45.

Figure 19:
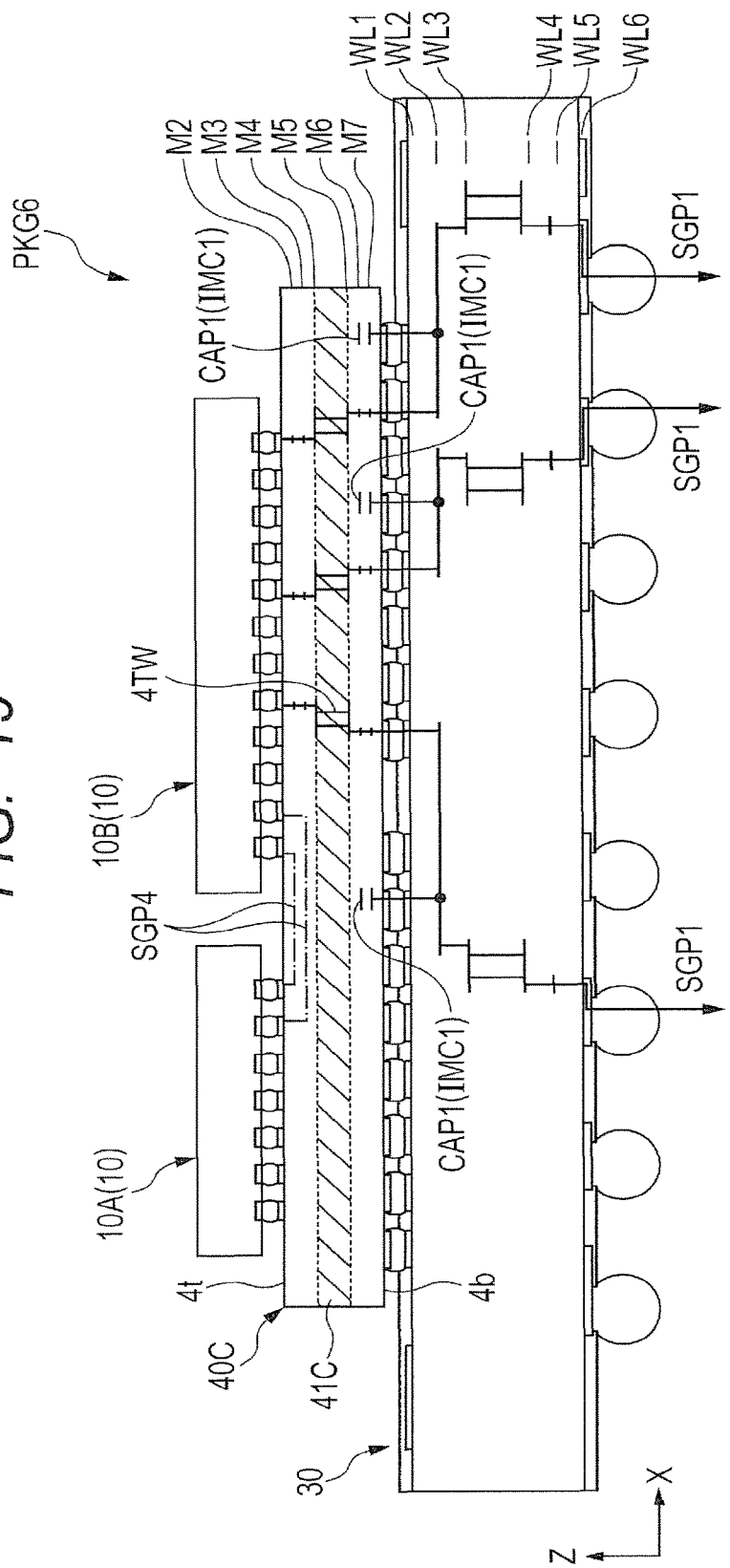
FIG. 19 schematically illustrates an example of arrangement of a plurality of high speed transmission paths and signal transmission paths for coupling between semiconductor components in a semiconductor device as a variation of the example shown in FIG. 7.

In the embodiment described above referring to FIG. 7, a single semiconductor chip 10 is mounted over the interposer 40. However, the number of semiconductor chips (semiconductor components) mounted over the interposer 40 is not limited to one; instead, a plurality of semiconductor chips (semiconductor components) 10 may be mounted over the interposer 40C like the semiconductor device PKG6 shown in FIG. 19. FIG. 19 schematically illustrates an example of the arrangement of a plurality of high speed transmission paths and signal transmission paths for coupling between semiconductor components in the semiconductor device as a variation of the example in FIG. 7.

The semiconductor device PKG6 shown in FIG. 19 is different from the semiconductor device PKG1 shown in FIG. 7 in that a plurality of semiconductor chips (semiconductor components) 10 are mounted over the interposer 40C. For example, the semiconductor device PKG6 includes a semiconductor chip (semiconductor component) 10A as a memory chip (memory package) with a storage circuit (memory circuit) and a semiconductor chip (semiconductor component) 10B as a logic chip (logic package) with a control circuit to control operation of the memory circuit. The semiconductor chip 10B has not only the control circuit but also an internal interface circuit to send signals to, and receive signals from, the memory circuit. The semiconductor chip 10B has an external interface circuit for transmission of signals with an external apparatus of the semiconductor device PKG6 (for example, the semiconductor device PKG2 shown in FIG. 1).

In contrast, the semiconductor chip 10A as a memory chip has an internal interface circuit which sends signals to, and receives signals from, the semiconductor chip 10B as a logic chip. The semiconductor chip 10A mainly receives signals from, and sends signals to, the semiconductor chip 10B and scarcely (or never) sends signals to, and receives signals from, an external apparatus. Therefore, most (at least half or all) of the signal transmission paths coupled with the semiconductor chip 10A are signal transmission paths SGP4 which transmit signals between the semiconductor chip 10A and the semiconductor chip 10B. In other words, the semiconductor chip 10A is electrically coupled with the semiconductor chip 10B through a plurality of signal transmission paths SGP4.

From the viewpoint of suppressing deterioration in the quality of signals transmitted through the signal transmission paths SGP4, it is desirable to shorten the wiring path distance of the signal transmission paths SGP4. In the example shown in FIG. 19, the signal transmission paths SGP4 are arranged preferentially in the wiring layers M2, M3, and M4 which lie between the insulating layer 41C as the core insulating layer and the top surface 4t. In other words, no signal transmission paths SGP4 are formed in the wiring layers M5, M6, and M7 which lie between the insulating layer 41C and the bottom surface 4b. The signal transmission paths SGP4 are not coupled with through hole wirings 4TW.

In contrast, a plurality of electrodes MP1 (see FIG. 8) which configure a plurality of capacitative elements CAP1 formed in the interposer 40C are formed in the wiring layers M5, M6, and M7 which lie between the insulating layer 41C and the bottom surface 4b. In the example shown in FIG. 19, since no signal transmission paths SGP4 are formed in the wiring layers M5, M6, and M7, space for the formation of a plurality of capacitative elements CAP1 is available. Conversely, in the example shown in FIG. 19, since the electrodes MP1 (see FIG. 8) which configure the capacitative elements CAP1 formed in the interposer 40C are not formed in the wiring layers M2, M3, and M4, the wiring resources of the signal transmission paths SGP4 in the wiring layers M2, M3, and M4 are increased.

As mentioned above, in the embodiment shown in FIG. 19, a plurality of signal transmission paths SGP4 are not formed in the wiring layers M5, M6, and M7 which lie between the insulating layer 41C and the bottom surface 4b. Basically the signal transmission paths SGP4 should be formed preferentially in the wiring layers M2, M3, and M4. This means that some of the signal transmission paths SGP4 may be formed in one of the wiring layers M5, M6, and M7. In that case, it is desirable that the number of signal transmission paths SGP4 running through one of the wiring layers M5, M6, and M7 be smaller than the number of signal transmission paths SGP4 not running through one of the wiring layers M5, M6, and M7.

The invention made by the present inventors has been so far explained concretely in reference to the preferred embodiments thereof. However, the invention is not limited thereto and it is obvious that these details may be modified in various ways without departing from the gist of the invention.

In the above embodiments, a semiconductor chip is mounted over an interposer. However, instead a semiconductor package (semiconductor component) which incorporates a semiconductor chip may be mounted over an interposer.

Furthermore, the planar shape of an electrode which configures a capacitative element in the above correction circuit is not limited to the roughly circular conductor pattern shown in FIG. 8 and the linear conductor pattern shown in FIG. 14 but it may be modified in various ways. For example, it may be polygonal or a combination of various patterns.

Several variations of the above first embodiment have been explained above. A combination of these variations may be adopted.

What is claimed is:

1. A semiconductor device comprising:
   a first substrate having a first front surface and a first back surface opposite to the first front surface;
   a second substrate having a second front surface and a second back surface opposite to the second front surface and being mounted over the first substrate with the first front surface of the first substrate facing the second back surface; and
   a first semiconductor component mounted over the second front surface of the second substrate and coupled with a first signal transmission path,
   the first signal transmission path comprising:
      a first coupling part to couple the first semiconductor component and the second substrate electrically;
      a second coupling part to couple the second substrate and the first substrate;
      a first external terminal formed on the first back surface of the first substrate;
      a first transmission part located in the second substrate to couple the first coupling part and the second coupling part electrically; and
      a second transmission part located in the first substrate to couple the second coupling part and the first external terminal electrically,
   wherein the first signal transmission path is coupled with a first circuit part having one edge coupled with a first branching part located midway in the first transmission part and the other edge coupled with a first capacitative element, and
   wherein the first capacitative element is formed in the second substrate.

2. The semiconductor device according to claim 1, wherein the first substrate and the second substrate each have a plurality of conductor patterns, and
wherein arrangement density of the conductor patterns in the second substrate is higher than arrangement density of the conductor patterns in the first substrate.

3. The semiconductor device according to claim 2,
wherein wiring path distance of the first transmission part is shorter than wiring path distance of the second transmission part.

4. The semiconductor device according to claim 3,
wherein the first substrate comprises a first core insulating layer, a first through hole wiring penetrating the first core insulating layer in a thickness direction, and a first through hole land coupled with the first through hole wiring, and
wherein an area of a first electrode configuring the first capacitative element is smaller than an area of the first through hole land.

5. The semiconductor device according to claim 1,
wherein the first substrate comprises a first core insulating layer, a first through hole wiring penetrating the first core insulating layer in a thickness direction, a first wiring layer lying between the first core insulating layer and the first front surface, and a second wiring layer lying between the first core insulating layer and the first back surface,
wherein the second substrate comprises a second core insulating layer, a second through hole wiring penetrating the second core insulating layer in the thickness direction, a third wiring layer lying between the second core insulating layer and the second front surface, and a fourth wiring layer lying between the second core insulating layer and the second back surface, and
wherein the first branching part of the first signal transmission path is formed in the third wiring layer of the second substrate.

6. The semiconductor device according to claim 5,
wherein a first electrode configuring the first capacitative element in the first circuit part is formed in the third wiring layer of the second substrate.

7. The semiconductor device according to claim 1,
wherein a first electrode configuring the first capacitative element is a conductor pattern with a larger width than a width of a wiring configuring the second transmission part of the first substrate.

8. The semiconductor device according to claim 1,
a first electrode configuring the first capacitative element being a conductor pattern comprising:
a first edge located on a side of the first branching part;
a second edge located opposite to the first edge and spaced from a conductor pattern other than the first electrode; and
an extending part to couple the first edge and the second edge.

9. The semiconductor device according to claim 1,
wherein the first substrate and the second substrate each have a plurality of wiring layers, and
wherein a distance between adjacent wiring layers in a thickness direction among the wiring layers of the second substrate is shorter than a distance between adjacent wiring layers in a thickness direction among the wiring layers of the first substrate.

10. The semiconductor device according to claim 9,
wherein the first substrate comprises a first core insulating layer, a first through hole wiring penetrating the first core insulating layer in the thickness direction, and a first through hole land coupled with the first through hole wiring, and
wherein an area of a first electrode configuring the first capacitative element is smaller than an area of the first through hole land.

11. The semiconductor device according to claim 1,
wherein a second semiconductor component electrically coupled with the first semiconductor component through a plurality of second signal transmission paths is mounted over the second front surface of the second substrate,
wherein the second substrate comprises a first core insulating layer, a plurality of first through hole wirings penetrating the first core insulating layer in a thickness direction, a first wiring layer lying between the first core insulating layer and the second front surface, and a second wiring layer lying between the first core insulating layer and the second back surface,
wherein the second signal transmission paths are not formed in the first through hole wirings and the second wiring layer, and
wherein a first electrode configuring the first capacitative element of the first circuit part is formed in the second wiring layer of the second substrate.

* * * * *